United States Patent
Edahiro et al.

(10) Patent No.: US 7,573,744 B2
(45) Date of Patent: Aug. 11, 2009

(54) SEMICONDUCTOR MEMORY DEVICE HAVING DIFFERENT CAPACITY AREAS

(75) Inventors: Toshiaki Edahiro, Yokohama (JP); Toshihiro Suzuki, Kawasaki (JP); Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 11 days.

(21) Appl. No.: 11/864,089

(22) Filed: Sep. 28, 2007

(65) Prior Publication Data

US 2008/0080243 A1 Apr. 3, 2008

(30) Foreign Application Priority Data

Sep. 29, 2006 (JP) ............................. 2006-266145

(51) Int. Cl.
*G11C 16/04* (2006.01)
(52) U.S. Cl. .............................. 365/185.17; 365/185.11
(58) Field of Classification Search ............ 365/185.11, 365/185.17
See application file for complete search history.

(56) References Cited

U.S. PATENT DOCUMENTS

| | | | | |
|---|---|---|---|---|
| 4,347,587 A | * | 8/1982 | Rao ....................... | 365/230.09 |
| 5,748,528 A | * | 5/1998 | Campardo et al. ..... | 365/185.13 |
| 5,777,925 A | * | 7/1998 | Tokushige .............. | 365/185.11 |
| 5,796,657 A | * | 8/1998 | Lee et al. ................ | 365/185.11 |
| 5,959,887 A | * | 9/1999 | Takashina et al. ...... | 365/185.13 |
| 6,088,264 A | * | 7/2000 | Hazen et al. ........... | 365/185.11 |
| 6,678,191 B2 | * | 1/2004 | Lee et al. ................ | 365/185.33 |
| 6,781,914 B2 | * | 8/2004 | Ha ......................... | 365/230.03 |
| 6,925,008 B2 | * | 8/2005 | Ichige et al. ............ | 365/185.17 |
| 6,937,513 B1 | * | 8/2005 | Desai et al. ............. | 365/185.11 |
| 7,082,055 B2 | * | 7/2006 | Ichige et al. ............ | 365/185.17 |
| 2007/0236985 A1 | | 10/2007 | Edahiro et al. | |
| 2008/0192542 A1 | * | 8/2008 | Lee et al. ................ | 365/185.08 |

FOREIGN PATENT DOCUMENTS

| JP | 2005-010942 | 1/2005 |
|---|---|---|
| JP | 2005-285161 | 10/2005 |

* cited by examiner

*Primary Examiner*—Son L Mai
(74) *Attorney, Agent, or Firm*—Oblon, Spivak, McClelland, Maier & Neustadt, P.C.

(57) ABSTRACT

There is provided a semiconductor memory device with NAND strings arranged therein, the NAND string having a plurality of electrically rewritable and non-volatile memory cells connected in series, including: a first data area; and a second data area, which is smaller in capacitance than the first data area and random accessible at a higher rate than the first data area.

17 Claims, 17 Drawing Sheets

FIG. 16

| State | Latch Data | Cell Data | | | | |
|---|---|---|---|---|---|---|
| | | E | A | B | C | |
| IDL | VL | 1 | 1 | 0 | 0 | |
| | VLB | 1 | 0 | 0 | 1 | |
| PRG | VL | 0 | 1 | 0 | 1 | Data Change of VL(E, C-Level) |
| | VLB | 1 | 0 | 0 | 1 | |
| A-Level Verify | VL | 0 | RD | 0 | 1 | If Inverted Data of VLB is "0", Keep Data |
| | VLB | 0 | 1 | 1 | 0 | Invert Data of VLB prior to Verify, and Restor after Verify<br>If VBL="1", Verify Read |
| C-Level Verify | VL | 0 | RD | 0 | RD | If VL="0", VOUT="0"<br>If VLB="0", Keep Data |
| | VLB | 1 | 0 | 0 | 1 | If VLB="1", Verify Read |

SEMICONDUCTOR MEMORY DEVICE HAVING DIFFERENT CAPACITY AREAS

CROSS-REFERENCE TO RELATED APPLICATION

This application is based on and claims the benefit of priority from the prior Japanese Patent Application No. 2006-266145, filed on Sep. 29, 2006, the entire contents of which are incorporated herein by reference.

BACKGROUND OF THE INVENTION

1. Field of the Invention

This invention relates to a semiconductor memory device, in which two data areas, i.e., a high-speed accessing area and a large capacity storing area, are set.

2. Description of the Related Art

There is increased a demand for NAND-type flash memories in accordance with increasing of the demand for mobile devices, which deal with large capacitive data such as a still or moving image. In the recent flash memories, since it is used such a multi level data storage scheme that two or more bits are stored in one memory cell, it has become possible to store a quantity of information with a relatively small chip area.

NAND-type flash memories are not suitable for a high speed random access use because the cell current is small, i.e., about one dozens in comparison with that of NOR-type flash memories. Therefore, in the conventional NAND-type flash memory, the data transmitting rate is substantially increased in such a way that data are read in a data buffer and then serially output, whereby it is made adaptable to a high speed system via a DRAM.

In the conventional NAND-type flash memories, cell information read is performed with a latch-type sense amplifier, in which the latch is selectively inverted in accordance with whether the charge in the latch is discharged or not based on the cell's ON/OFF. With this sense scheme, it takes some micro seconds to access a memory cell and read data thereof.

Further, in the multi-level data storage scheme, it is difficult to set a word line voltage at a read time to be sufficiently higher in comparison with the cell threshold voltage, and the cell current is not more than about several hundreds nA. To improve the read performance of the NAND-type flash memory, it is in need of sensing a small cell current at a high rate.

As a sense amplifier sensing a small cell current at a high rate, there has already been provided such a latch-type and current-sensing type of sense amplifier that amplifies a cell current difference between a memory cell and a reference cell (for example, refer to JP-A-2005-285161).

In the currently used mobile devices, it is used such a configuration that program data such as OS and the like are stored in a NOR-type flash memory capable of high-speed accessing while a large capacitive file data such as image data, music data and the like are stored in a NAND-type flash memory. That is, since it is not required of the program data to be often rewritten, a NOR-type flash memory with a low write speed is used as a ROM. While, since the NOR-type flash memory is random accessible at a high rate, it is directly coupled to a CPU, and serves for directly code-executing.

Therefore, in case a code data is stored in the NAND-type flash memory, it is copied to a buffer memory such as DRAM, and then the code is executed from the DRAM. Further, the NAND-type flash memory control unit not only performs data input/output transferring but also serves as an address transformation function that converts a logic address input from the external to a physical address, and an ECC function that detects and corrects errors in the read out data.

However, in case the above-described two-chip configuration with a NOR-type flash memory and a NAND-type flash memory is used, both of the system cost and the package area increase. Therefore, it will be desired to use one chip while it is random-accessible and storable with a large quantity of data.

In the conventional. NAND-type flash memory, a sector containing certain bits serves as an access unit, and sequential access will be performed. Therefore, the NAND-type flash memory is not adaptable to random access necessary for a CPU when executing a program such as OS. Therefore, in case a NAND-type flash memory is used in place of a NOR-type flash memory, to execute the program such as OS stored in the NAND-type flash memory, it is in need of outputting the program to a DRAM.

To achieve the above-described system, it is required to prepare a small boot-use ROM such as a mask ROM, a NOR-type flash memory and the like, and store such software that executes previous processing for transferring the program stored in the NAND-type flash memory to a DRAM and for executing it (for example, refer to JP-A-2005-10942).

Since, a cost of a boot-use ROM becomes usually lower as capacity thereof becomes smaller, the software stored in the ROM is limited in magnitude to a minimum as necessary. In a conventional case, stored in the boot-use ROM are only an instruction code used for initially setting an external bus control unit and a memory control unit and another instruction code used for transferring the program stored in the NAND-type flash memory to a DRAM.

SUMMARY OF THE INVENTION

According to an aspect of the present invention, there is provided a semiconductor memory device with NAND strings arranged therein, the NAND string having a plurality of electrically rewritable and non-volatile memory cells connected in series, comprising:

a first data area; and a second data area, which is smaller in capacity than the first data area and random accessible at a higher rate than the first data area.

According to another aspect of the present invention, there is provided a semiconductor memory device including:

a first data area including first and second cell arrays, in which a plurality of electrically rewritable and non-volatile memory cells are arranged, main portions thereof serving as information cells for storing data while the others serve as reference cells;

a first sense unit disposed between the first and second cell arrays to detect a current difference between an information cell selected from one cell array and a reference cell selected from the other cell array to sense data;

a second data area including third and fourth cell arrays, in which a plurality of electrically rewritable and non-volatile memory cells are arranged, main portions thereof serving as information cells for storing data while the others serve as reference cells; and a second sense unit disposed between the third and fourth cell arrays to detect a current difference between an information cell selected from one cell array and a reference cell selected from the other cell array to sense data, wherein the first data area serves as such a sequential access-use bank that a sector defined by a certain number of bits serves as an access unit while the second data area serves as such a random access-use bank that is smaller in capacity than the first data area and random accessible at a higher rate than the first data area.

BRIEF DESCRIPTION OF THE DRAWINGS

FIG. 16 shows the data transition in the data latch at the lower page write time.

DETAILED DESCRIPTION OF THE EMBODIMENTS

Illustrative embodiments of this invention will be explained with reference to the accompanying drawings below.

Figure 1:
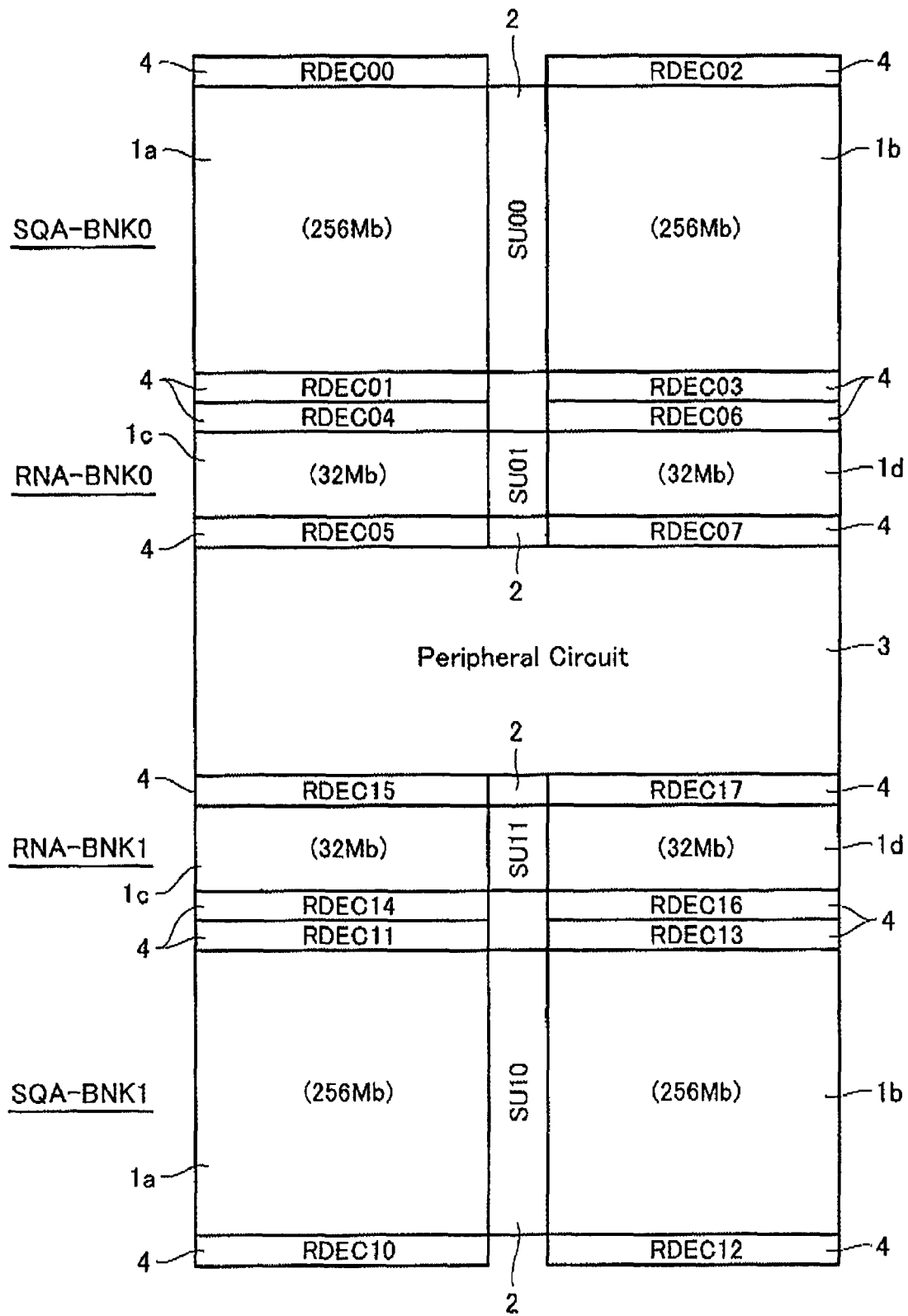
FIG. 1 shows a chip layout of a NANO-type flash memory in accordance with an embodiment of the present invention.

FIG. 1 shows an outlined layout of a NAND-type flash memory chip in accordance with this embodiment. This memory chip contains banks, RNA-BNKi and SQA-BNKi. RNA-BNKi is a random accessible data area while SQA-BNKi is a sequential accessing data area with a capacity larger than RNA-BNKi.

A center portion of the chip is a peripheral circuit area 3. High-speed random-access-use banks RNA-BNK0 and RNA-BNK1 are disposed to sandwich the peripheral circuit portion 3. Further disposed outside the random access-use banks RNA-BNK0 and RNA-BNK1 are sequential access-use banks SQA-BNK0 and SQA-BNK1, which are sequentially accessed in such a way that a sector defined by a certain number of bits serves as an access unit.

Each of random access-use banks RNA-BNK0 and RNA-BNK1 is formed of two cell arrays 1*c* and 1*d*, which are disposed to sandwich sense units (SU01, SU11), and serve as program storage areas for storing OS and the like.

Each of sequential access-use banks SQA-BNK0 and SQA-BNK1 is formed of two cell arrays 1*a* and 1*b*, which are disposed to sandwich sense units (SU00, SU10), and serve as file data storage areas for storing music and/or image data.

Each of cell arrays 1*a*, 1*b*, 1*c* and 1*d* has a plurality of information cell NAND strings and at least one reference cell NAND string. In the sequential access-use banks SQA-BNK0 and SQA-BNK1, when an information cell NAND string is selected from one of cell arrays 1*a* and 1*b*, the reference cell NAND String is selected from the other cell array, and data will be sensed with a sense unit, which detects a cell current difference between the information cell NAND string and the reference cell NAND string.

Similarly, in the random access-use banks RNA-BNK0 and RNA-BNK1, when an information cell NAND string is selected from one of cell arrays 1*c* and 1*d*, the reference cell NAND string is selected from the other cell array, and data will be sensed with a sense unit based on a cell current difference between the information cell NAND string and the reference cell NAND string.

The random access-use banks RNA-BNK0 and RNA-BNK1, one cell array of which has a capacity of 32 Mb, constitute a bank of 128 Mb in total with four cell arrays. The sequential access-use banks SQA-BNK0 and SQA-BNK1, one cell array of which has a capacity of 256 Mb, constitute a bank of 1 G-bit in total with four cell arrays.

Row decoders 4 for selecting word lines are dispersedly disposed at the both ends of word lines in the respective cell arrays. Explaining in detail, as row decoders 4 of sequential access-use bank SQA-BNK0, (RDEC00, RDEC01) and (RDEC02, RDEC03) are disposed to sandwich the cell arrays 1*a* and 1*b*, respectively, while as row decoders 4 of random access-use bank RNA-BNK0, (RREC04, RDEC05) and (RDEC06, RDEC07) are disposed to sandwich the cell arrays 1*c* and 1*d*, respectively.

As similar to this, as row decoders 4 of sequential access-use bank SQA-BNK1, (RDEC10, RDEC11) and (RDEC12, RDEC13) are disposed to sandwich the cell arrays 1*a* and 1*b*, respectively, while as row decoders 4 of random access-use bank RNA-BNK1, (RREC14, RDEC15) and (RDEC16, RDEC17) are disposed to sandwich the cell arrays 1*c* and 1*d*, respectively.

A physical difference between the random access-use bank RNA-BNK and the sequential access-use bank SQA-BNK is in that word line lengths thereof are different from each other. That is, RNA-BNK is formed of 2048 bit lines while SQA-BNK is formed of 16384 bit lines. Therefore, the word line length of RNA-BNK is one eighth in comparison with that of SQA-BNK, and this makes the RNA-BNK random-accessible at a high rate. Note here that the bit line length of RNA-BNK is the same as that of SQA-BNK.

One reason why the NAND flash memories are not adaptable to random accessing is in that the cell current is small because multiple memory cells are corrected in series to constitute a NAND string. Another reason is in that word line length and bit line length are set to be large for the purpose of making the driver circuits as less as possible. As a result, parasitic resistances and parasitic capacitances become large, so that random accessing becomes unsuitable.

In this embodiment, with a current detecting type of sense unit as described later, a high-speed performance with respect to the bit line direction, i.e., shortening the sensing time, may be achieved while an access time will be substantially decided due to a word line selecting time in case a word line is long. Therefore, to achieve a high-speed access, it is desirable that the word line is set to be as short as possible.

While, since the whole memory cells or a half thereof in memory cells coupled to a selected word line are collectively written, it is desired to make the word line length as long as possible for the purpose of writing as many as possible memory cells at a time. It is not impossible to select such a condition that many cell arrays with a short word line length are arranged, and word lines in multiple cell arrays are simultaneously selected. It is, however, in need of dividing a word line in this case, and it is necessary to prepare a quantity of row decoders for selecting word lines, whereby the chip area increases.

In consideration of the above-described situation, in this embodiment, two kinds of memory banks are combined as follows: one memory bank has short word lines and serves as a high-speed random access-use; and another memory bank has long word lines and serve for storing a large capacity of data and for writing data at a high rate. With this scheme, the chip area increase may be suppressed while one data area is random-accessible, and the other data area is made large in capacity and high-speed writable.

The chip layout shown in FIG. 1 is only an example, and other word line lengths, bit line lengths and cell array layouts are selectable.

Figure 2:
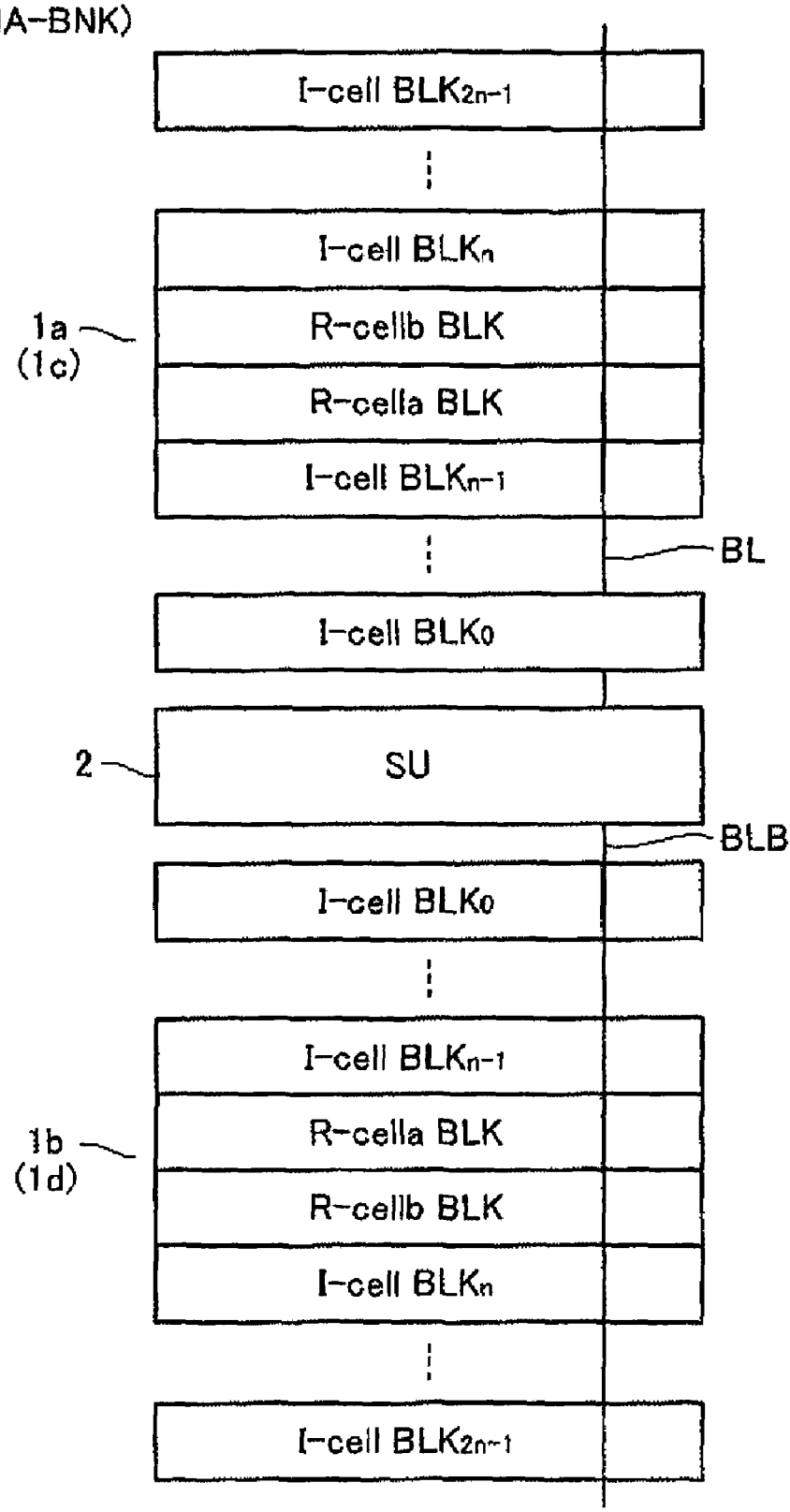
FIG. 2 shows a block configuration of the cell array of the flash memory.

FIG. 2 shows a block configuration of cell arrays 1*a* and 1*b* constituting a sequential access-use bank, SQA-BNK. A block configuration of cell arrays 1*c* and 1*d* constituting a random access-use bank, RNA-BNK, may be formed as similar to that of SQA-BNK except that word line lengths are different from each other.

As shown in FIG. 2, 2n−1 information cell blocks, I-cellBLKi (i=0~2n−1), are arranged, in each of which "information cells, I-cell" are arranged to store data, in each cell array 1*a*, 1*b* (or 1*c*, 1*d*). Additionally disposed in each cell array 1*a*, 1*b* is at least one, first reference cell block, R-cellaBLK, in which "reference cells, R-cella" are arranged for generating a reference current used for reading cell data of an information cell I-cell.

Explaining in detail, when one information cell block I-cellBLK is selected from one cell array 1*a*, one reference cell block R-cellaBLK is selected from the other cell array 1*b*, and simultaneously selected information cell and reference cell are coupled to a pair of bit lines BL and BLB. Similarly, when one information cell block I-cellBLK is selected from one cell array 1*b*, one reference cell block R-cellaBLK is selected from the other cell array 1*a*.

In the example shown in FIG. 2, reference cell blocks R-cellaBLK are disposed at the central portions in the cell arrays 1*a* and 1*b*, respectively.

Disposed in each cell array 1*a*, 1*b* in addition to the first reference cell block, R-cellaBLK, is at least one second reference cell block, R-cellbBLK, in which "reference cells, R-cellb" are arranged for generating a reference current used at a write-verify time of the reference level of the reference cell block R-cellaBLK and an erase-verify time of the information cell.

The reference cell in the first reference cell blocks R-cellaBLK has the same structure as the information cell to be writable and erasable as similar to the information cell. By contrast, although the reference cell in the second reference cell blocks R-cellbBLK is basically the same structure as the information cell, it will be formed as a passive reference current source, which is not writable and erasable.

Figure 3:
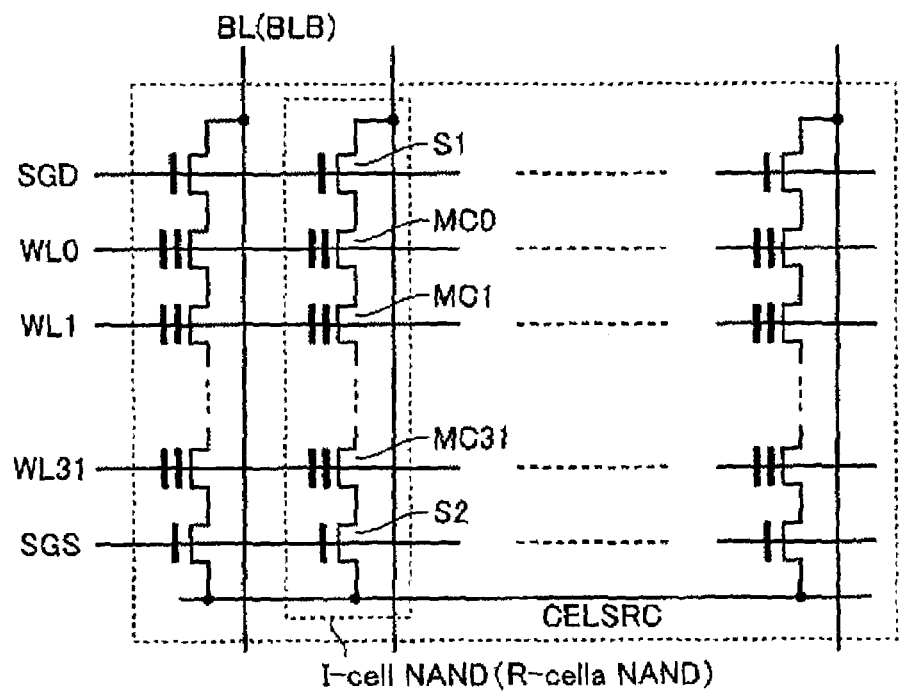
FIG. 3 shows a configuration of an information cell block and a first reference cell block in the flash memory.

FIG. 3 shows a common configuration of the information cell block I-cellBLK and the first reference cell block R-cellaBLK, in which multiple NAND cell units (i.e., NAND strings), I-cellNAND and R-cellaNAND, are arranged in a matrix manner.

Each NAND string has a plurality of (32 in this example) electrically rewritable and non-volatile memory cells MC0-MC31 connected in series. Each memory cell has a MOS transistor structure with a floating gate and a control gate stacked thereabove, and store data in a non-volatile manner in accordance with a charge stored state in the floating gate.

One end of the NAND string is coupled to a bit line BL (or BLB) via a select gate transistor S1 while the other end is coupled to a common source line CELSRC via another select gate transistor S2.

Control gates of the memory cells MC0-MC31 are coupled to word lines WL0-WL31, respectively. Gates of the select gate transistors S1 and S2 are coupled to select gate lines SGD and SGS, respectively, which are disposed in parallel with the word lines. A set of multiple NAND strings sharing word lines WL0-WL31 constitute a "block" serving as an erase unit.

As explained above with reference to FIG. 2, every one selected from multiple blocks arranged in the direction of the bit line in the cell arrays 1*a* and 1*b* is set as the first reference cell block R-cellaBLK. It is optional which block is to be selected as the first reference cell block in multiple NAND string blocks. However, after having set the first reference cell block once, it is fixedly used hereinafter as the first reference cell block, and the others are used as information cell blocks I-cellBLK.

Figure 4:
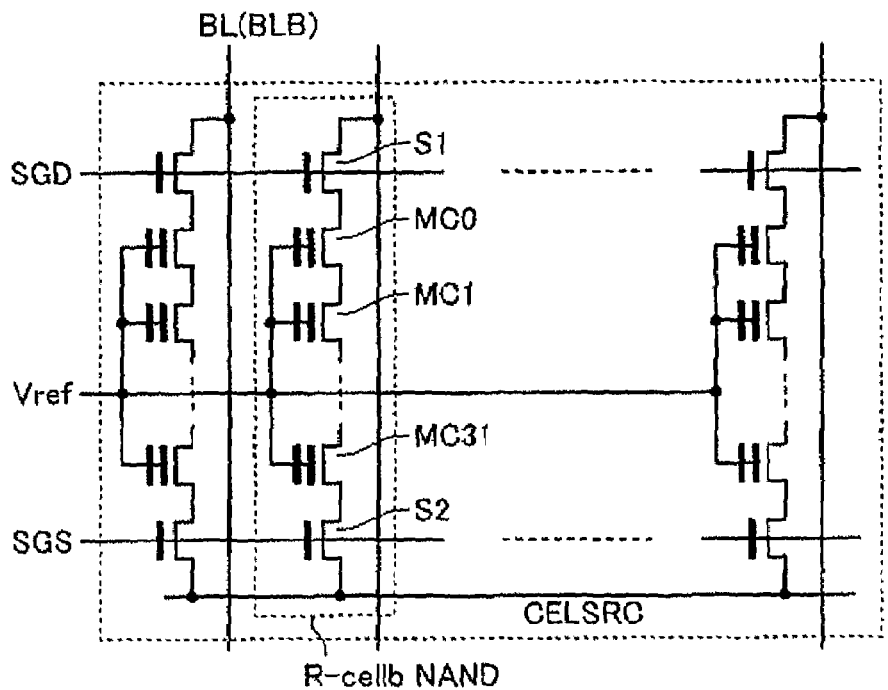
FIG. 4 shows a configuration of a second reference cell block of the flash memory.

FIG. 4 shows a configuration of the second reference cell block R-cellbBLK, which has basically the same structure as the information cell block I-cellBLK and the first reference cell block R-cellaBLK. However, the NAND string block, R-cellbNAND, has a gate wiring, which short-circuits all control gates and floating gates of memory cells MC0-MC31, and a reference voltage Vref is applied to the gate line. That is, all memory cells connected in series serve as one transistor for generating a reference current.

It is possible to form in principle a reference current source, which is used for detecting a cell current, at an input portion of the sense amplifier as being separated from the cell array. However, forming all reference current sources in the cell array with the same structure as the memory cells, it becomes possible to obtain the reference current sources without variations and without using a wasteful transistor area.

To make the sequential access-use bank SQA-BNK possible to store data with a large capacity, it is necessary to use a multi-level data storage scheme. For example, in this embodiment, a four-level data storage scheme is used as shown in FIG. 5.

Figure 5:
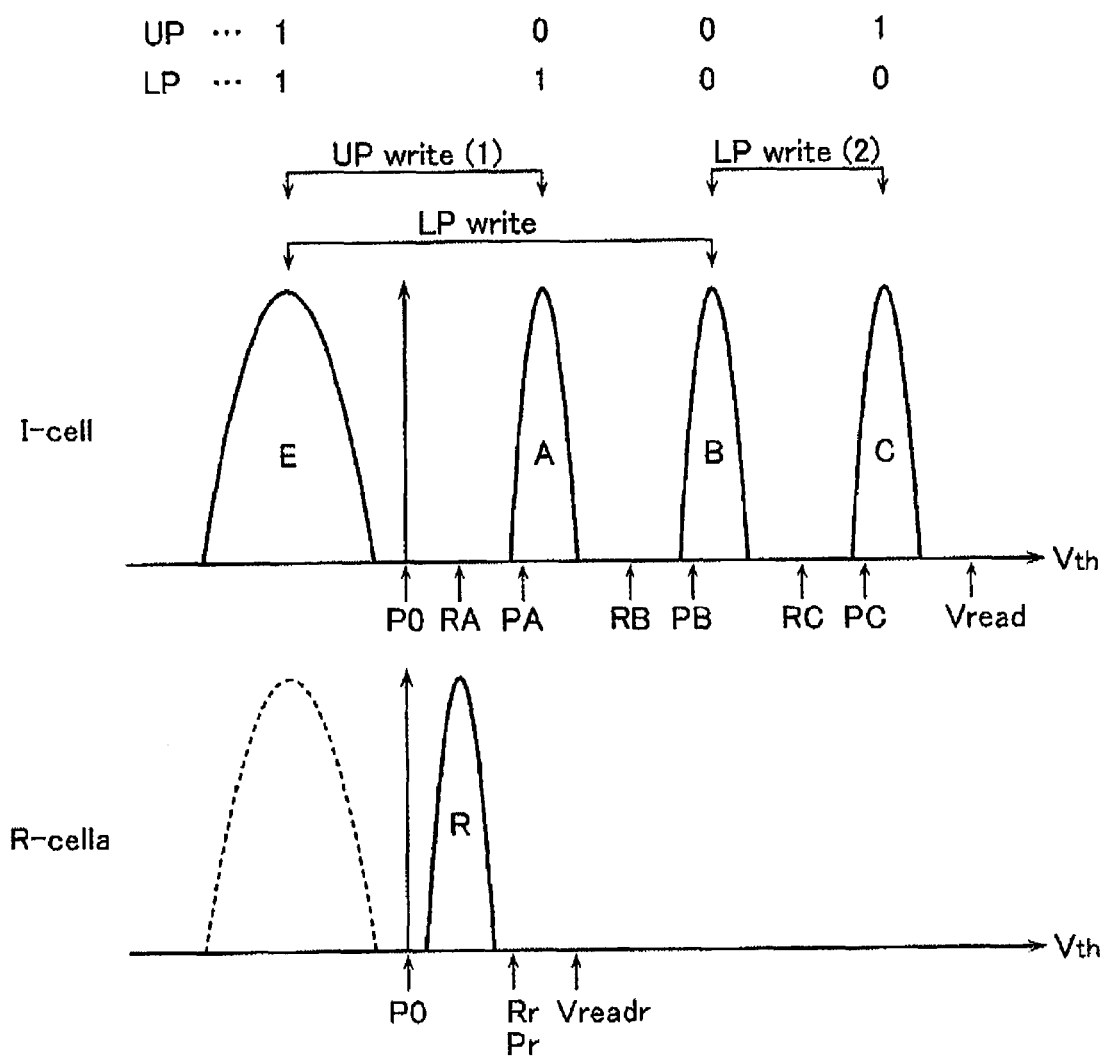
FIG. 5 shows four-level data threshold distributions and the bit assignment of the flash memory

FIG. 5 shows the data threshold distributions for the information cell I-cell and the reference cell. R-cella in this four-level data storage scheme. As shown in FIG. 5, four data level states E, A, B and C are set in the order of the threshold voltage.

Upper page data, UP, and lower page data, LP, are assigned to these data levels as follows. Four-level data being expressed by (UP, LP), data state E is defined as (1, 1); data state A as (0, 1); data state B as (0, 0); and data state C as (1, 0).

Data state E is an erase state with a negative threshold voltage. As a data write, initially, lower page write will be performed in such a way that memory cells in the data state E are selectively made higher in threshold voltage as being defined as data state B. At the upper page write time, two kinds of write modes are performed simultaneously as follows: (0, 1) write for selectively increasing the threshold voltage of memory cells in data state E to that of data state A; and (1, 0) write for selectively increasing the threshold voltage of memory cells in data state B to that of data state C. Therefore, it is in need of reading out the previously written lower page data, and executing the write control with reference to the read out data.

Suppose that the reference cell R-cella is written into a reference level R defined by about 0V threshold level from data state E as similar to the binary data storage scheme. At a write-verify time of an information cell, it will be performed such a verify-read that a difference between a cell current of the information cell I-cell and another cell current (i.e., reference current) of the reference cell R-cella is detected.

Verify voltage is set at PA, PB and PC for data states A, B and C, respectively; and that applied to the reference cell is set at Pr. It is the same as a binary data storage scheme that data detection is performed by comparing the cell current Ic of the information cell I-cell with the reference cell current Ir of the reference cell R-cella.

In the bit assignment example shown in FIG. 5, the lower page read is performed once with read voltage RS while it is required of the upper page read to use two times read operations with read voltages RA and RC. In this case, the upper page data judgment may be performed by judging whether the number of data "1" is even or odd. That is, when the number of "1" is even, the upper page data is judged as "1" while when the number of "1" is odd, it is judged as "0".

As described above, the lower page write is performed in the same manner as in case of the binary data storage scheme. By contrast, it is required of the upper page write to determine which level is to be set based on the externally input write data and the lower page data which has been written. Further, at the upper page write-verify time, it is necessary to judge which level is to be verified.

In the four-level data storage scheme, it takes a long time to sense data in comparison with the binary data storage scheme. In consideration of this situation, in this embodiment, the binary data storage scheme is adapted to the random access-use bank RNA-BNK, in which a high speed performance is required. For example, only the lower page (LP) data, i.e., data levels E and B in the four-level data storage scheme explained with reference to FIG. 5, are used as binary data.

Dealing with binary data, the memory cell current is made large in the random access-use bank RNA-BNK. The reason is as follows. Since each gap between adjacent data levels is narrow in the multilevel memory cell, it is difficult to set the word line voltage to have a large margin against data levels. By contrast, it is easy to set the word line voltage to have a large margin against data levels in the binary memory cell because only two levels are used. As a result, it becomes possible in the binary data storage scheme to sense data at a high rate in comparison with the four-level data storage scheme.

Note that sequential access-use bank SQA-BNK serves for storing not only multi-level data but also binary data in correspondence with the applications.

Figure 6:
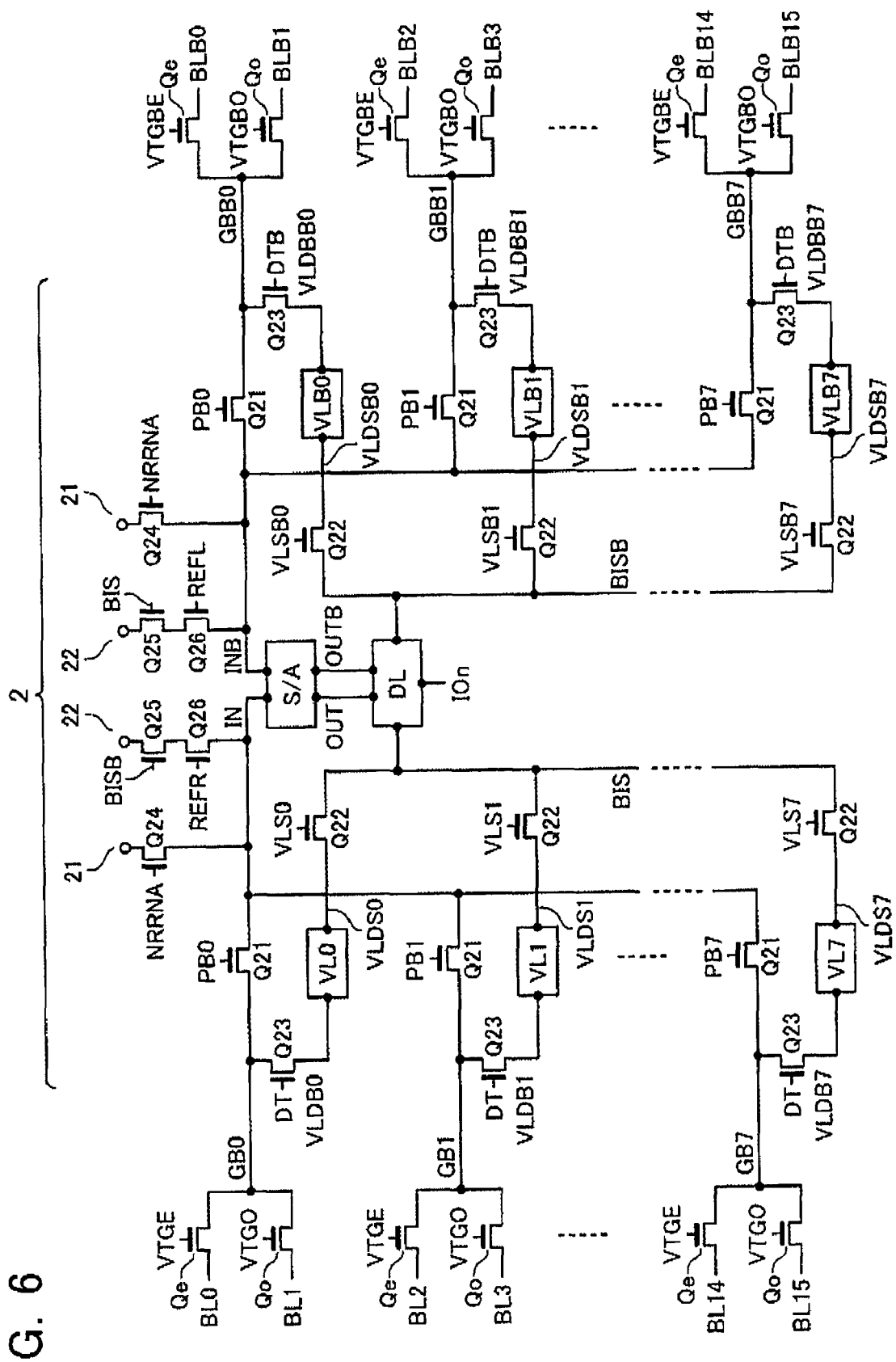
FIG. 6 shows a sense unit used for random access-use bank RNA-BNK for storing binary data in the flash memory.

FIG. 6 shows a detailed configuration of a sense unit, i.e., SU01, or SU11, in the random access-use bank side. Here is shown such an example that 16 bit line pairs share a sense amplifier S/A. That is, the sense amplifier S/A is disposed between 16-bit lines BL (BL0-BL15) on the side of a cell array constituting a bank and 16-bit lines BLB (BLB0-BLB15) on the side of another cell array constituting another bank.

Even numbered bit lines and odd numbered bit lines are selectively coupled to nodes GB0-GB7 and GBB0-GBB7 via select transistors Qe and Qo driven by signal VTGE and VTGO, respectively. These nodes GB0-GB7 and GBB0-GBB7 are selectively coupled to input nodes IN and INB of the sense amplifier S/A via transfer transistors Q21 driven by signals PB0-PB7 and PBB0-PBB7, respectively.

The bit line select transistors Qe and Qo are high breakdown voltage ones while the others in the sense amplifier are low voltage-use ones.

To hold write data, eight data latches VL (VL0-VL7) are disposed on the bit line BL side, the number of which is equal to that of simultaneously selected bit lines BL. Similarly, eight data latches VLB (VLB0-VLB7) are disposed on the bit line BLB side, the number of which is equal to that of simultaneously selected bit lines BLB.

8-data latches VL disposed in correspondence to 16-bit lines BL share a data transfer node BIS while 8-data latches VLB disposed in correspondence to 16-bit lines BLB share another data transfer node BISB.

In principle, data latches VL, are used in case of data writing on the bit line BL side while data latches VLB are used in case of data writing on the bit line BLB side. With this data latch arrangement, it becomes possible to perform data write at a quantity of (i.e., all even bit lines or all odd bit lines) bit lines simultaneously.

Data nodes VLDB (VLDB0-VLDB7) of data latches VL are coupled to nodes GB, respectively, via transfer transistors Q23 driven by signal DT at a time. At a data write time, bit line voltage will be controlled in accordance with write data held in the data latches VL. Data nodes VLDS (VLDS0-VLDS7) of data latches VL are coupled to the data transfer node BIS via transfer transistors Q22, which are driven by signals VLS (VLS0-VLS7) generated at different timings.

Similarly, data nodes VLDBB (VLDBB0-VLDBB7) of data latches VLB are coupled to nodes GBB, respectively, via transfer transistors Q23 driven by signal DTB at a time. Data nodes VLDSB (VLDSB0-VLDSB7) of data latches VLB are coupled to the data transfer node BISB via transfer transistors Q22, which are driven by signals VLSB (VLSB0-VLSB7) generated at different timings.

Output nodes OUT and OUTB of the sense amplifier S/A are selectively coupled to data line IOn via a data transfer control circuit DL. Additionally, output node OUT and OUTB are selectively coupled to data transfer nodes BIB and BISB under the control of the data transfer control circuit DL. That is, data transfer between the sense amplifier S/A and data latches VL or VLB is performed via the common data transfer nodes BIS or BISB.

Both data latches VL and VLB serve for storing write data to be loaded. Data in one of the data latches is rewritten in accordance with the verify-read result when the corresponding cell array is selected, and serves for bit line voltage controlling while data on the other is kept as it is for verify controlling until the whole write cycles end.

That is, at a verify-read time in each write cycle, bit line data are sequentially sensed by the sense amplifier S/A and the sense output is transferred to data latch VL or VLB via data transfer node BIS or BISB, whereby the write data is rewritten in accordance with the verify-result.

At the input nodes IN and INB of the sense amplifier S/A, precharge circuits 21, are disposed for precharging the bit lines BL and BLB at a normal read time, each of which is formed of transistor Q24 driven by signal NRRNA.

Further disposed at the input nodes IN and INB are verify control circuits (i.e., pull-up circuits) 22 for forcedly level-setting the output nodes OUT and OUTB of a certain sense amplifier S/A at a verify-read time. In detail, this pull-up circuits 22 serve for preventing "1" write cell from being "0" write in the following cycle 1 at a write-verity read time and setting the "1" write mode again.

These pull-up circuits 22 are formed of transistors Q26 driven by timing signals REFR and REFL, and transistors Q25 connected in series to transistors Q26 and driven by the nodes BIB and BISB, to which data of the latch VL and VLB are transferred.

Figure 7:
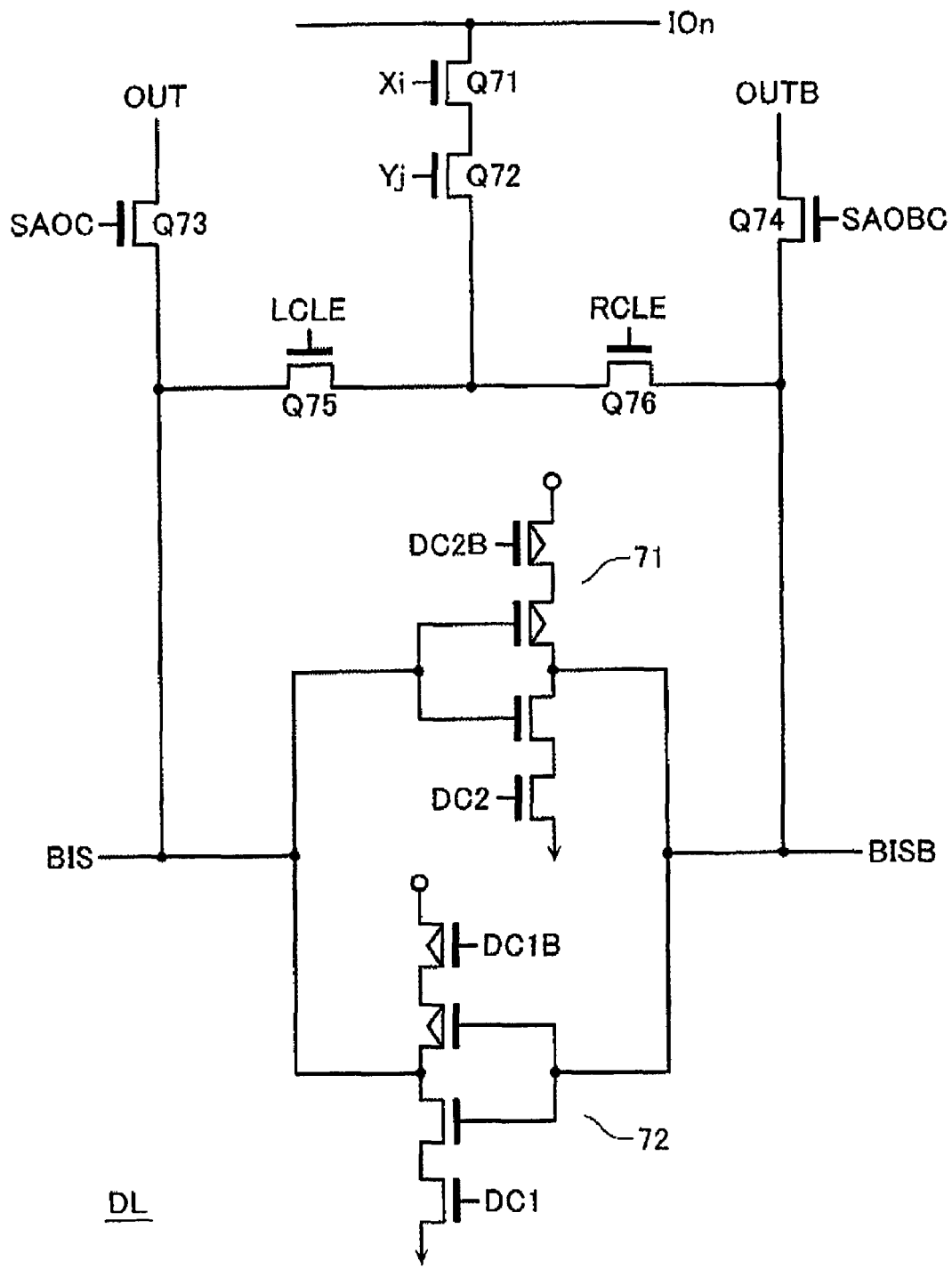
FIG. 7 shows a data transfer control circuit shown in FIG. 6.

FIG. 7 shows the configuration of the latch-type transfer control circuit DL, which has a latch with a combination of clocked CMOS inverters 71 and 72. Data transfer nodes BIS and BISB are shared by data latches VL and VLB to be connected to the input nodes of these data latches, respectively. In addition, these nodes BIS and BISB are selectively coupled to the internal data line IOn via transistors Q71 and Q72 driven by selection signals Xi and Yj, and via transistors Q75 and Q76 driven by signals LCLE and RCLE, respectively.

Output node OUT of the sense amplifier S/A and the node BIS, and output node OUTB and node BISB are coupled to each other with transistors Q73 and Q74 driven by gate signals SAOC and SAOBC, respectively.

Data transfer control circuit DL serves for inverting data in addition to the connection controls between data latches VL and VLB and sense amplifier S/A, and between the output nodes OUT and OUTB and data bus line IOn.

Figure 8:
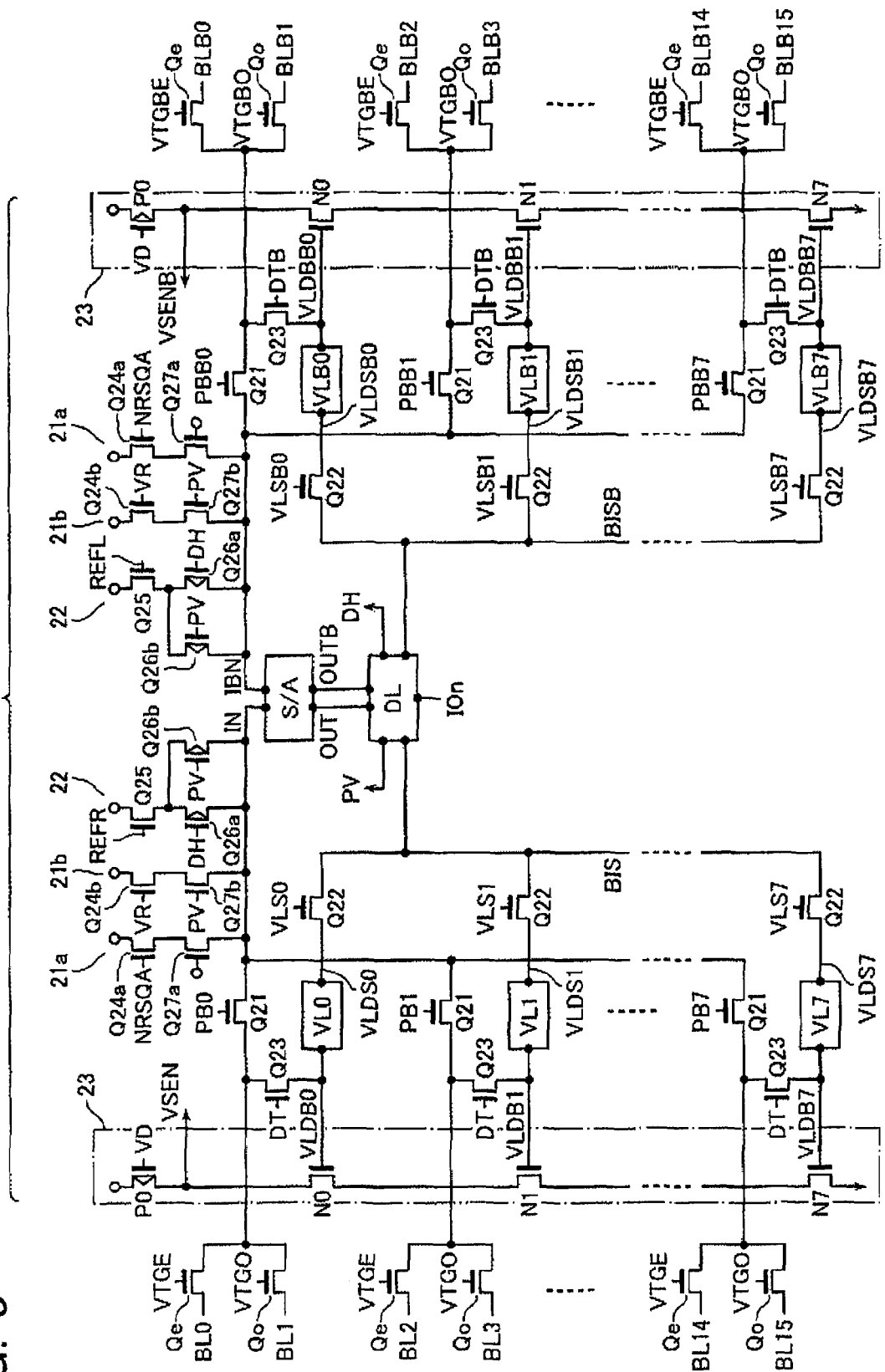
FIG. 8 shows another sense unit used for sequential access-use bank SQA-BNK for storing four-level data in the flash memory.

FIG. 8 shows a sense unit 2, i.e., SU00, SU10, adapted to four-level data storage scheme on the sequential access-use bank SQA-BNK, in such a case that each sense amplifier is dispose for 16-bit line pairs, in correspondence to that disposed on the random access-use bank RNA-BNK as shown in FIG. 6. The same portions as those in FIG. 6 are referred to as the same reference symbols and the detailed explanation will be omitted.

As similar to the binary data storage scheme, data latches VL are disposed on the bit line BL side with the same numbers as the bit line numbers; and data latches VLB on the bit line BLB side with the same numbers as the bit line numbers.

As different from the binary data storage scheme, precharge circuits 21a used at a normal read time and precharge circuits 21b used at a verify-read time are disposed to be independent from each other. This is because that it is in need of controlling the bit line voltage at the verify-read time in the four-level data storage scheme.

Normal read-use precharge circuit 21a is formed of serially connected transistors Q24a and Q27a, gates of which are driven by signal NRSQA and Vdd, respectively. Verify-read-use precharge circuit 21b is formed of serially connected transistors Q24b and Q27b, gates of which are driven by signal VR and node PV, respectively.

Pull-tip circuits (verify-control circuit) 22, each of which serves for controlling the sense amplifier state after sensing for verify-controlling, are also different from that used in the binary data storage scheme. That is, each pull-up circuit 22 is formed of serially connected NMOS transistor Q25 driven by control signal REFR (or REFL) and a pair of PMOS transistors Q26a and Q26b, which are connected in parallel to be driven by nodes DH and PV, respectively. Transferred to the nodes DH and PV are write data.

Collective verify-judgment circuit 23 is formed to be able to detect an all "0" state in data latches VL or VLB. Note here that write data in data latches VL and VLB are defined by data nodes VLDS and VLDSB on the data transfer nodes BIB and BISB sides, respectively.

Explaining in detail, verify-read results after writing on the bit lines BL and BLB are sequentially loaded in data latches VL and VLB, respectively. Each collective verify-judgment circuit 23 is formed of node VSEN, which is precharged by precharge PMOS transistor P0, and NMOS transistors N0 to N7 coupled to the node VSEN in series, which are driven by data nodes VLDB0 to VLDB7 of data latches VL (or data nodes VLDBB0 to VLDBB7 of data latches VLB).

Verify-read data is controlled in such a manner that "0" is stored in data latch VL or VLB when write has been confirmed for each bit. If data latches VL or VLB become an all "0" state, all NMOS transistors N0-N7 in the collective verify-judgment circuit 23 are turned on, so that the node VSEN is discharged, and this level transition becomes a write completion signal.

Figure 9:
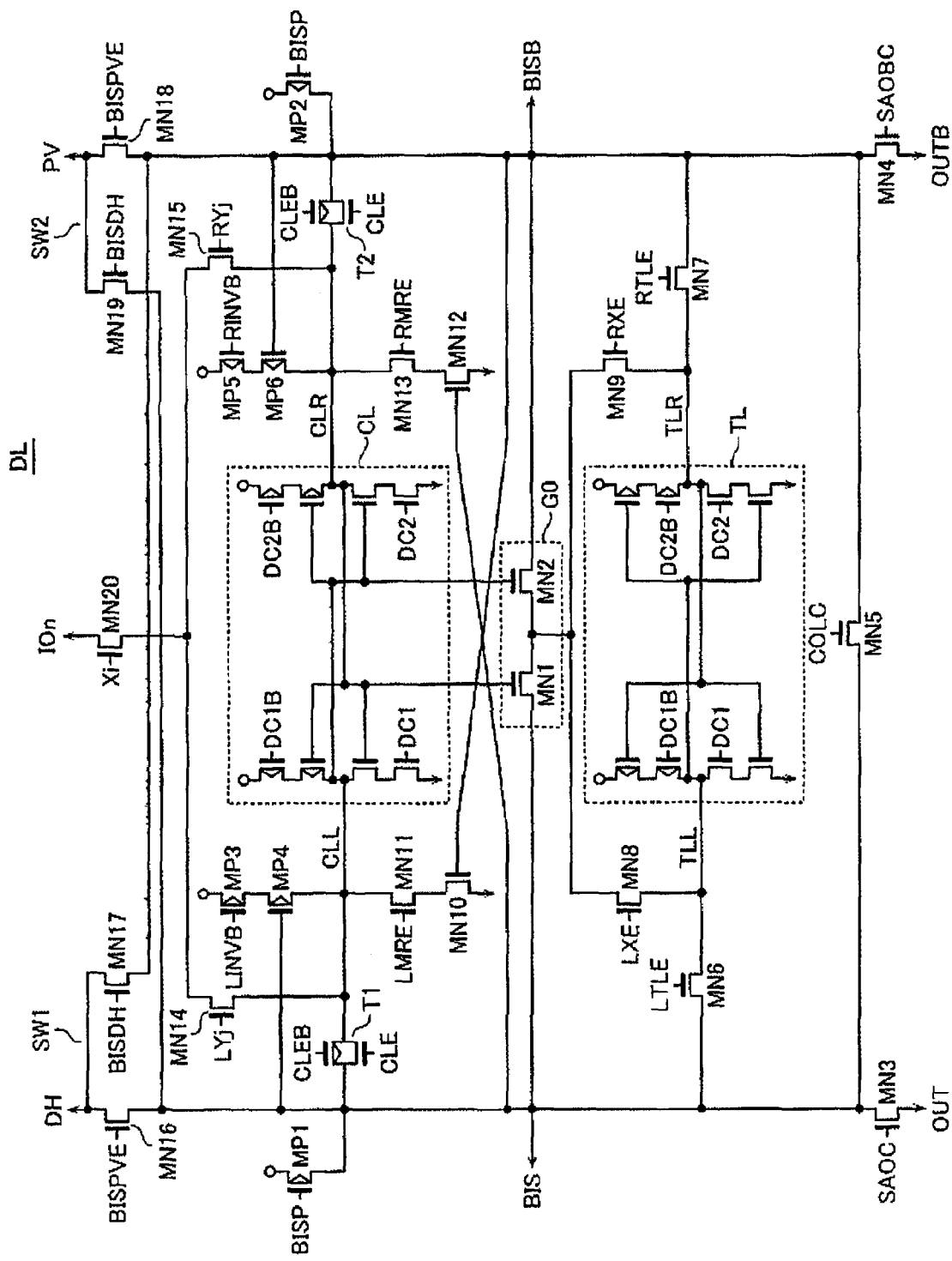
FIG. 9 shows a data transfer control circuit shown in FIG. 8.

Since it is required of the data transfer control circuit DL coupled to the output of the sense amplifier S/A to execute complicated data processing in comparison with the binary data storage scheme, the configuration is, as shown in FIG. 9, quite different from that in the binary data storage scheme shown in FIG. 7. That is, the data transfer control circuit DL includes two latches CL and TL with clocked CMOS inverters, which are selectively coupled to data transfer nodes BIS and BISB, and serve, for example, for inverting data at a verify time.

Data nodes CLL and CLR of latch CL are coupled to data transfer nodes BIS and BISB via CMOS transfer gates T1 and T2, respectively. Further, data nodes CLL and CLR are selectively coupled to data line IOn via NMOS transistors MN14, MN15 and MN20 driven by select signals LYj, RYj and Xi, respectively.

Data transfer nodes BIS and BISB are selectively coupled to output nodes OUT and OUTB of sense amplifier S/A via transfer NMOS transistors MN3 and MN4. To selectively couple the data transfer nodes BIS and BISB to nodes DH and PV as it is or with data inverting if necessary, switch circuits SW1 and SW2 are disposed therebetween.

NMOS transistors MN1 and MN2 with a common drain, the gates of which are driven by data nodes CLR and CLL, sources thereof being coupled to data transfer nodes BIS and BISB, constitute an exclusive OR (XOR) gate G0. The common drain is selectively coupled to either one of data nodes TLL and TLR of latch TL via NMOS transistors MN8 and MN9.

That is, at the NMOS transistors MN1 and MN2, data held in latch CL and data sensed with sense amplifier S/A and transferred to node BIS or BISB are subjected to an XOR operation. The operation result will be stored in latch TL.

Although there is not shown a collective verify-judgment circuit in the sense unit 2 on the random access-use bank shown in FIG. 6, it is permissible to dispose a collective verify-judgment circuit as well as shown in FIG. 8.

Figure 10:
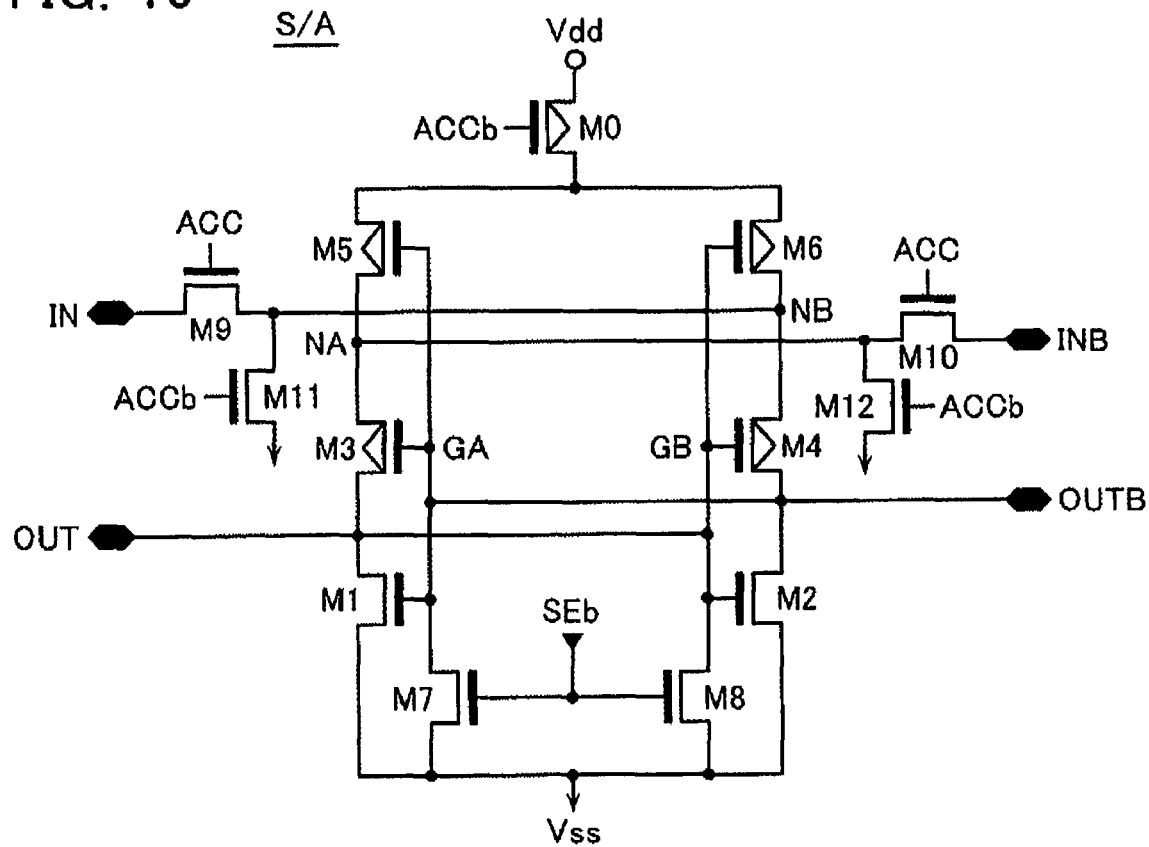
FIG. 10 shows a sense amplifier used in the sense unit.

FIG. 10 shows the configuration of the sense amplifier S/A in the sense unit 2 described above. This sense amplifier S/A is a current detecting type of differential amplifier with a latch formed of PMOS transistors M3, M4 and NMOS transistors M1, M2.

The common drain of serially connected PMOS transistor M3 and NMOS transistor M1, the gates of which are coupled in common to node GA, serves as one output node OUT. Similarly, the common drain of serially connected PMOS transistor M4 and NMOS transistor M2, the gates of which are coupled in common to node GB, serves as the other output node OUTB. The common gates GA and GB are coupled to the output nodes OUTB and OUT, respectively, as crossing.

PMOS transistors M3 and M4 are coupled to the power supply node Vdd via PMOS transistors M5 and M6 and current source PMOS transistor M0. The gates of PMOS transistors M5 and M6 are coupled to the common gates GA and GB, respectively. The gate of the current source PMOS transistor M0 is driven by activation signal ACCb.

The sources of NMOS transistors M1 and M2 are coupled in common to the ground potential node Vss. The common gates GA and GB are coupled to the ground potential node Vss via NMOS transistors M7 and M8, the common gate of which is driven by activation signal SEb.

Connection node NA between PMOS transistors M5 and M3 is coupled to one input node INB via NMOS transistor M10 driven by activation signal ACC. Similarly, connection node NB between PMOS transistors M6 and M4 is coupled to the other input node IN via NMOS transistor M9 driven by activation signal, ACC. These portions serve for separating the sense amplifier waiting from bit line precharging and making the sense amplifier operation time short, so that the sense amplifier becomes possible to sense data with low power consumption.

Reset-use NMOS transistors M11 and M12 are coupled to the nodes NB and NA, respectively, the gates of which are driven by activation signal ACCb. These are used for resetting the nodes NA and NB at Vss while the sense amplifier S/A is inactive (ACCb="H").

Next, the operation of sense amplifier S/A will be explained in detail. At a normal data read time, a cell current difference between an information cell. I-cell and a reference cell R-cella is reflected on the differential input nodes IN and INB, and it will be detected. In an inactive state with ACCb="H" and SEb="H", NMOS transistors M3, M4, M7 and M8 are on, so that nodes GA, GB, NA and ND and output nodes OUT and OUTB are reset at Vss.

Figure 11:
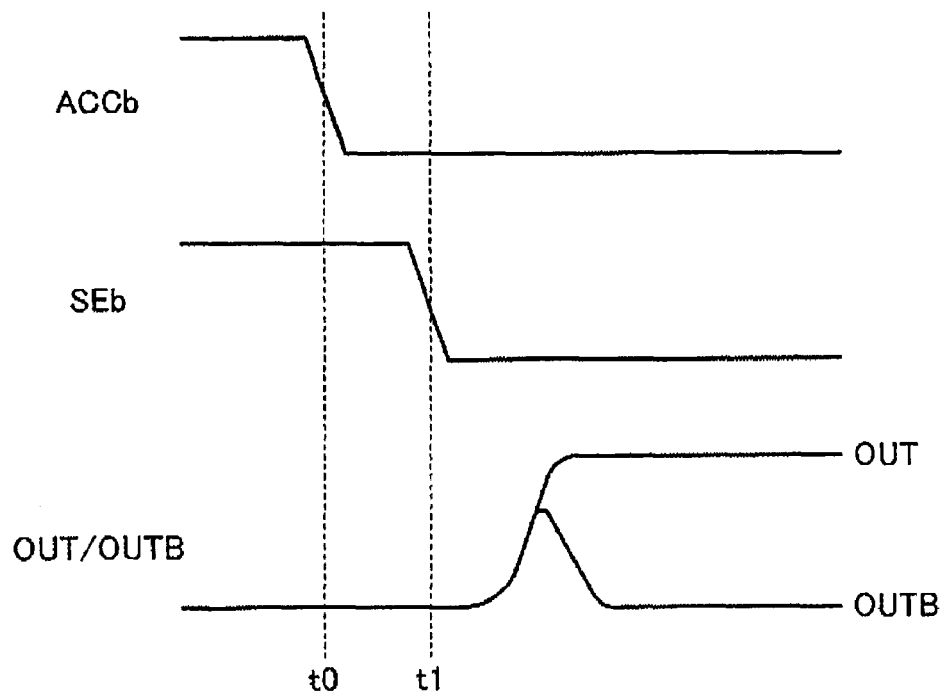
FIG. 11 shows operation waveforms of the sense amplifier.

When a word line is selected from each cell array, and a pair of bit lines BL and BLB are coupled to the differential input nodes IN and INB, as shown in FIG. 11, ACCb is set as "L" (timing t0), and then SEb is set at "L" with a little delay (timing t1), whereby the sense amplifier S/A is activated. Assuming that an information cell I-cell, and a reference cell R-cella are selected on the bit lines BL and BLB respectively, cell currents thereof are supplied to nodes NB and NA, respectively.

Just after the sense amplifier activation, NMOS transistors M1 and M2 are off while PMOS transistor M0 is on; and NMOS transistors M7 and M8 are on. Therefore. output nodes OUT (=GB) and OUTB (=GA) are charged up with a power supply current from Vdd and cell currents superimposed thereon. When a voltage difference is generated between output nodes OUT and OUTB (i.e., between gate nodes GA and GB) based on the cell current difference, a positive feedback operation occurs in the latch such as to amplify the differential voltage between the output nodes OUT and OUTB, and the differential voltage will be increased rapidly.

Supposing that, for example, OUT (GB) is lower than OUTB (GA), NMOS transistor M1 is on; NMOS transistor M2 off; PMOS transistor M3 off; and PMOS transistor M4 on in accordance with the positive feedback from node SEb, so that output nodes OUT and OUTB are set at Vss and Vdd, respectively.

This sense amplifier S/A has in principle no influences on the sensing speed due to the bit line-bit line capacitance, and is capable of sufficiently high speed sensing even if in a NAND-type flash memory with a bit line capacitance of about several pF and a cell current of about several hundreds nA.

Figure 12:
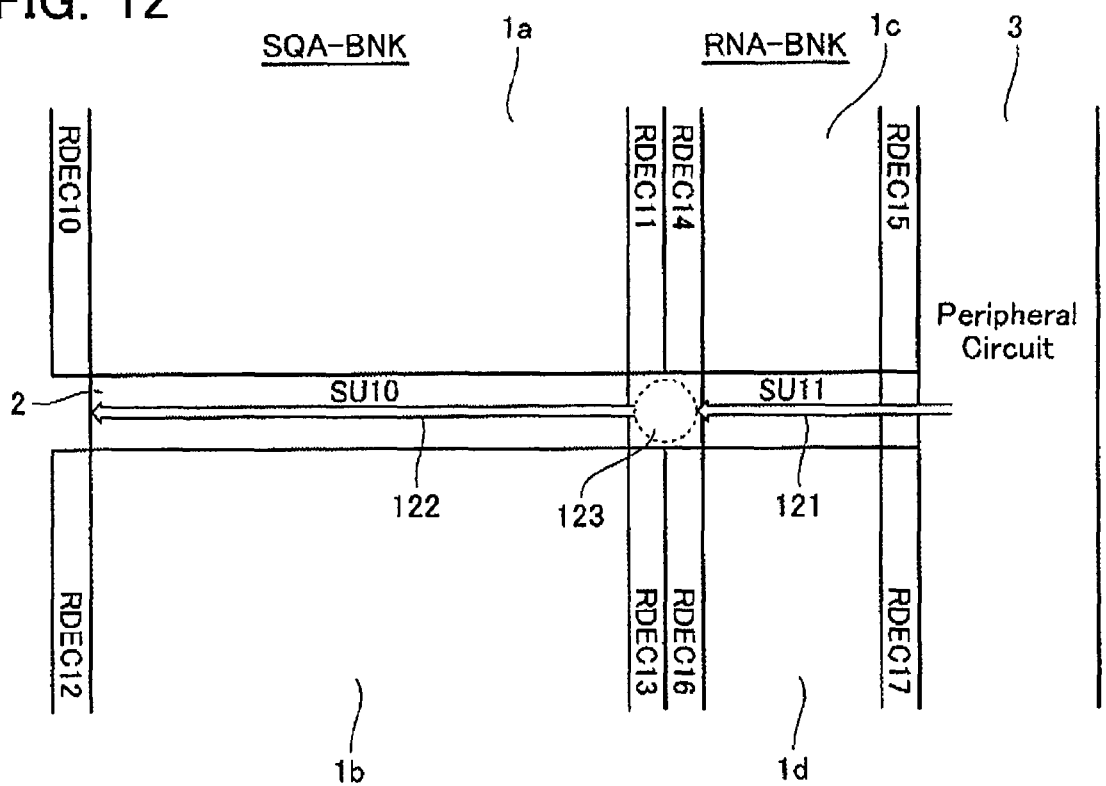
FIG. 12 shows a layout of sense unit control signal lines disposed to extend over two bank areas.

It is desirable to use the same S/A control signals between the sequential access-use bank SQA-BNK and the random access-use bank RNA-BNK. As shown in FIG. 12, S/A control signal lines, which extend to the respective sense unit areas from the peripheral circuit area 3, are disposed on the area of the sense unit 2.

Control signal lines 121 on the random access-use bank RNA-BNK near the peripheral circuit area 3 disposed at the chip central portion and control signal lines 122 on the sequential access-use bank SQA-BNK are physically separated from each other with transfer gate circuit 123 disposed between the both sense unit areas.

Figure 13:
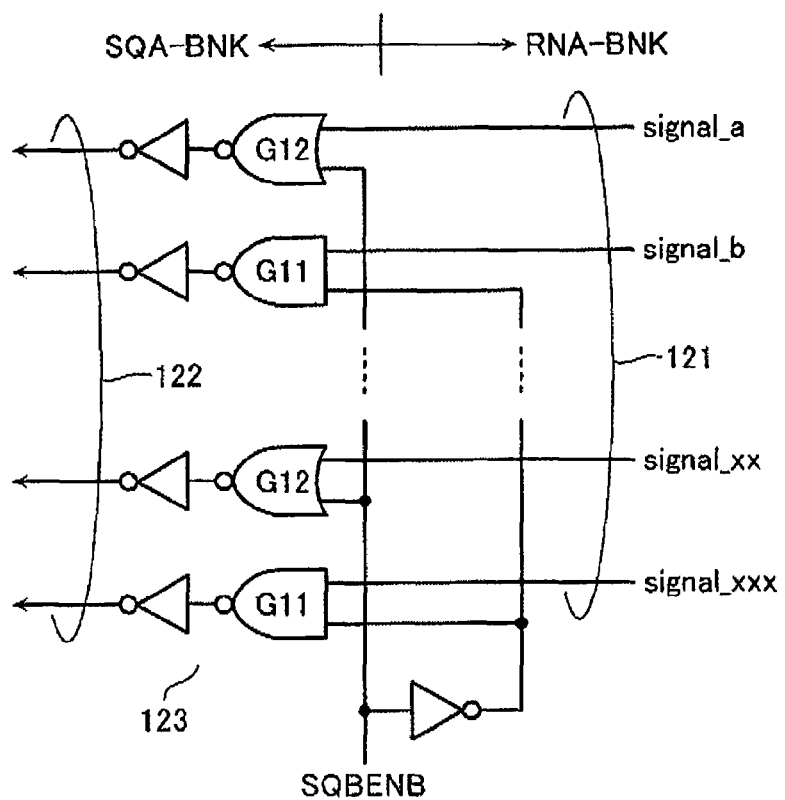
FIG. 13 shows a transfer gate circuit of the control signal lines disposed between sense units of two banks.

FIG. 13 shows an example of the transfer gate circuit 123, which has NAND gates G11 and NOR gates G12 controlled by select signal SQBENB. These NAND gates G11 and NOR gates G12 are prepared to fixedly set the control lines on the SQA-BNK at "L" and "H" while RNA-BNK is accessed.

Explaining in detail, in case SQBENB is "L", both NAND gates G11 and NOR gates G12 are active. Therefore, S/A control signals may be transferred to the sense unit on SQA-BNK as it is from the peripheral circuit 3. While, in case SQBENB is "H", Both NAND gates G11 and NOR gates G12 are inactive, so that control signals from the peripheral circuit 3 are transferred to only the sense unit on RNA-BNK via control signal lines 121. Control signal lines 122 disposed on the SQA-BNK side are fixed in potential at "H" or "L".

When SQBENB="L", as described above, the same S/A control signals are supplied to the sense unit of both RNA-BNK and SQA-BNK. However, preparing different bit line precharge signals NRRNA and NRSQA, and preparing sense amp activation signals ACCbRNA and ACCbSOA as the activation signal ACCb in the sense unit configurations shown in FIGS. 6 to 8, it becomes possible to make the sense amplifier current flow only either one of RNA-BNK and SQA-BNK even if the remaining signals are common. That is, it is possible to activate only the sense unit on RNA-BNK while letting that on SQA-BNK be inactive.

As described above, disposing the transfer control gate circuit 123 between sequential access-use bank SQA-BNK and random access-use bank RNA-BNK, the control signal lines 121 and 122 are isolated from each other, whereby it becomes possible to reduce the load capacitance. The detail will be explained below.

On the SQA-BNK side, many sense amplifiers S/A are arranged, and the control signal lines 122 have a large load capacitance. By contrast, when RNA-BNK is accessed, the control signal lines 122 are fixed in potential with the transfer control gate circuit 123, whereby the load capacitance may be reduced to the gate capacitance of the gate circuit 123 from the line capacitance of the control signal lines 122.

As a result, signals will be transmitted to high speed-use and the random access-use RNA-BNK at a high rate. With respect to the sequential access-use bank SQA-BNK, even if there is a little transmission delay, it does not become a large problem because SQA-BNK is subjected to sequential accessing.

Next, four-level data read and write operations on the sequential access-use bank SQA-BNK will be explained. Prior to four-level data write, a selected block is erased in a lump, and all cells are set at the erase state E. Further, with respect to the reference cell blocks R-cellaBLK of the both cell arrays, reference level R is written into all cells. These write operations are the same as in the binary data storage scheme, and the detailed explanation will be omitted.

(Lower Page Write)

First, lower page (LP) write that is for selectively threshold-shifting from data state E to data state B will be explained. Here, suppose that a set of information cells selected by a word line and even bit lines (BL0, BL2, . . . ), i.e., one page, are written at a time.

Figure 14:
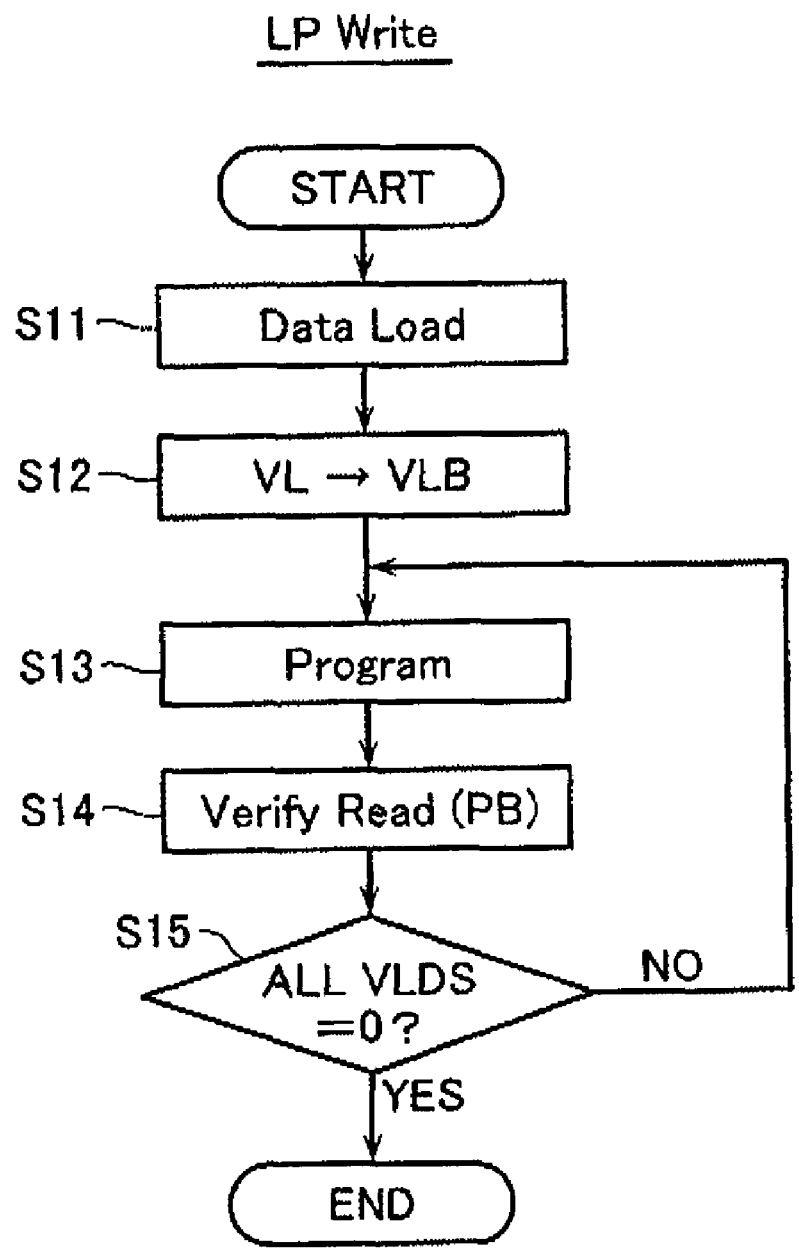
FIG. 14 shows the upper page write sequence of the four-level data.

FIG. 14 shows a LP write sequence. Following command input, a selected page address and write data are loaded (step S11). If data write is performed for the bit line BL side, write data are loaded in data latches VL, and these are transferred to data latches VLB (step S12).

Following it, write voltage is applied to the selected word line (step S13). After write voltage applying, write-verify is performed to verify the write state (step S14).

Next, write completion is judged by detecting whether data latches VL become in an all. "0" state (VLDS="0") or not. If there is an incompletely written cell in the page, write will be repeated until all cells are sufficiently written.

The write operation will be explained in detail. In case of "1" writing, it is in need of applying Vdd to the corresponding bit line while in case of "0" writing, 0V is applied to the corresponding bit line. In FIG. 9, the initial signal state is as follows:

BISPVE=BISDH=LMRE=RMRF=CLE=LXE=RXE=LTLE=RTLE=COLC=SAOC=SAOBC=DC1=DC2=Xi=RYj=LYj="L"; and LINVB=RINVB=CELEB=DC1B=DC2B=BISP="H".

Initially, write data is loaded from the external via data line IOn. Setting Xi-RYj-CLE=VLS0=CLKB=DC1="H"; and CLK=DC1B=CLEB="L", the externally supplied write data is inverted in data latch CL, and then transferred to data latch VL via data transfer node BIS.

That is, when the externally input data is "1", data latch VL is set at a state of: VLDS="1"; and VLDB="0" while when the input data is "0", then VLDS="0"; and VLDB="1".

Repeating the above-described data loading operation with signals VLS0-VLS7 sequentially switched in the range of one sense amplifier, inverted write data may be loaded in data latches VL<0:7>. The same data load operations are performed in a range of multiple sense amplifiers, and write data of a selected page will be loaded in data latches VL<0:7>.

After inputting all write data, write data in data latches VL are transferred to and loaded in data latches VLB on the bit line BLB side. Explaining in detail, data transfer nodes BIB and BISB are short-circuited with COLC="H", and at the same time, data in data latch VL is transferred to data latch VLB with VLS=VLSB="H".

Sequentially switching VLSB0-VLSB7 and VLS0-VLS7 to repeat the above-described transfer operation, the same data will be loaded in data latches VLB<7:0> as in data latches VL<7:0>.

In case data write is performed for information cells on the bit line BL, bit line control voltage is determined by data in data latches VL. That is, in accordance with write data "1" and "0", i.e., VLDB=Vdd and Vss, are transferred to bite lines BL via transfer transistors Q23 and select transistors Qe (or Qo). Write data in data latches VLB are kept until data write sequence ends, and serve for bit line precharge controlling at a verity read time.

In case information cells on the even bit lines are written, odd bit lines are non-selected and applied with Vdd to be set in a write-inhibit mode.

Bit line side select gate line SGD of the selected block is applied with Vdd; source line side select gate line SGS with Vss; the selected word line with write voltage Vpgm; and non-selected word lines with write pass voltage Vpass (e.g., 10V).

With this voltage application, if the bit line is 0V, the selected cell's channel is set at 0V, so that write operation (electron injection to the floating gate) occurs. By contrast, if the bit line is Vdd, the selected cell's channel is boosted by capacitive coupling, so that write operation is inhibited.

In case the information cells on the bit line BLB side are written, externally supplied write data are inverted via the latch circuit CL and loaded in data latches VLB, and the same write data are loaded in data latches VL. In accordance with data in data latches VLB, bit line voltage control is performed. The others are the same as in the case of bit line BL side writing.

Next, the information cell I-cell, to which the write voltage has been applied, will be subjected to write-verify reading. The verify-read is dealt with a current comparison operation between the selected information cell I-cell on the bit line BL side and a reference cell R-cella on the bit line BLB side. At this time, verify voltage applied to the selected word line on the selected information cell I-cell is set at PB while verify voltage applied to a selected reference word line on the reference cell R-cella is set at Pr. Non-selected word lines are applied with the write pass voltage.

If the written reference level R of the reference cell block R-cellaBLK is near 0V, it is possible to select a verify voltage Vread2 applied to the reference word line on the reference cell block R-cellaBLK to be sufficiently lower than the verify voltage Vread applied to the selected word line on the information cell block I-cellBLK.

The result of the current comparison between the information cell I-cell and reference cell R-cella will be judged as follows: if Ic<Ir, data state B has been written while if Ic>Ir, data state E is kept as it is.

At an initial setting step of the verify-read, all input nodes IN and INB, and output nodes OUT and OUTB of the sense amplifier S/A are set at Vss with ACCb=SEb="H" and ACC="L". Then, a bit line pair is selected in accordance with input address. For example, at a verify time for an information cell on the bit line BL0, bit lines BL0 and BLB0 will be precharged with VTGE=VTGBE="H" (e.g., 5V), and PB0=PBB0=Vdd.

Bit line precharge at a normal data read time is performed with bit line precharge circuit 21a, and all bit lines are precharged equally. By contrast, at the lower page write-verify time, precharge signal VR and precharge circuit 21b controlled by data node PV are used.

The precharge operation with the precharge circuit 21b will be explained as follows. First, as previous to the precharge operation, set VLSB0=VLS0=BISPVE=Vdd+Vth, and transfer data in data latches VLB0 and VL0 to data nodes PV and DH, respectively, which are used for verify-controlling.

In detail, data in data latch VLB0 is transferred to data transfer node BISB, and then transferred to data node PV via transistor MN18 in the switch circuit SW2, Data in data latch VL0 is transferred to data transfer node BIS, and then transferred to data node DH via transistor MN16 in the switch circuit SW1.

Therefore, if data of latch VLB is "1", precharge circuit 21b is turned on to precharge the bit line while if data of latch VLB is "0", precharge circuit 21b is kept off with node PV="0", bit line precharge is not performed.

As described above, in case data in data latch VLB is "0", i.e., in case of "1" writing bit line (i.e., write-inhibited cell) that is not required to be subjected to verify-read, bit line precharge is not performed. As a result, wasteful power consumption will be reduced.

After precharging as described above, ACCb="L" and ACC="H" are set, and the bit line pair is coupled to the sense amplifier S/A. Following it, setting SEb="L", the sense amplifier S/A is activated to amplify the cell current difference between input nodes IN and INB in the positive feedback mode. As described above, if cell current Ic of the information cell I-cell is larger than the reference current Ir, it leads to OUT="H" while if not so, OUT="L" is obtained.

That is, if "0" write information cell becomes to have a desired threshold voltage defined as data state B, the sense amplifier S/A outputs OUT="L" (=Vss). The "0" write information cell has not reached data state B, OUT="H" (=Vdd) will be obtained.

While, in case data in data latch VL is "0", and "0" write is not performed in the selected information cell (i.e., "1" write case), the sense output is OUT="H". If this sensed data is transferred to data latch VL as it is, it becomes "0" write condition in the next cycle.

With respect to this situation, the pull-up circuit 22 on the bit line BL side functions as follows. REFR="H" is applied to the pull-up circuit 22 on the bit line BL side simultaneously with the starting of current flowing in the sense amplifier S/A. As a result, in case data transferred to data node DH is "0" (i.e., "1" write), the pull-up circuit 22 is turned on to supply current to the input node IN the sense amplifier S/A, so that the sense amplifier output is forcedly set at OUT="L".

The sensed output data described above is transferred to data latch VL0 with VLS0=SAOC="H". At this time, CLKB="H" and CLK="L" are set in data latch VL0.

As a result of the verify-read described above, the write data in data latch VL0 is restored in accordance with verify-read result in such a manner that an information cell, in which "0" write has been sufficiently done, is set at the "1" write state hereinafter; and the "1" write information cell is set at the "1" write state again.

The above-described verify-read operations will be sequentially performed for all selected even bit lines, and write and write-verify are repeated until all selected information cells have been written into desired data states.

Verify-judgment is performed with collective verify-judgment circuit 23. If all cells have been written into desired data states, data latches VL will be set at a state of: VLDS<7:0>=Vss (="0"); and VLDB<7:0>=Vdd (="1") after verifying. The signal node VSEN is previously precharged to Vdd by PMOS transistor P0. If all selected information cells have been written, all NMOS transistors N0-N7 are turned on to discharge the node VSEN to Vss, so that write completion is detected. If the signal node VSEN is not discharged, write operation will be performed again.

In case of the information cell's verify-read on the bit line BLB side, data in data latch VL is transferred to node PV; and data in data latch VLB to node DR. Therefore, in the switch circuits SW1 and SW2, BISDH=Vdd+Vth is set. In addition data input of the selected information cell and the reference cell into the sense amplifier will be reversed in comparison with the case of the bit line BL side selection. In consideration of this, to activate the pull-up circuit 22 on the bit line BLB side, REFL="H" is set. Data at the output node OUTB of the sense amplifier S/A is transferred to data latch VLB. The others are the same as the case described above with respect to the information cell on the bit line BL side.

(Upper Page Write)

Figure 15:
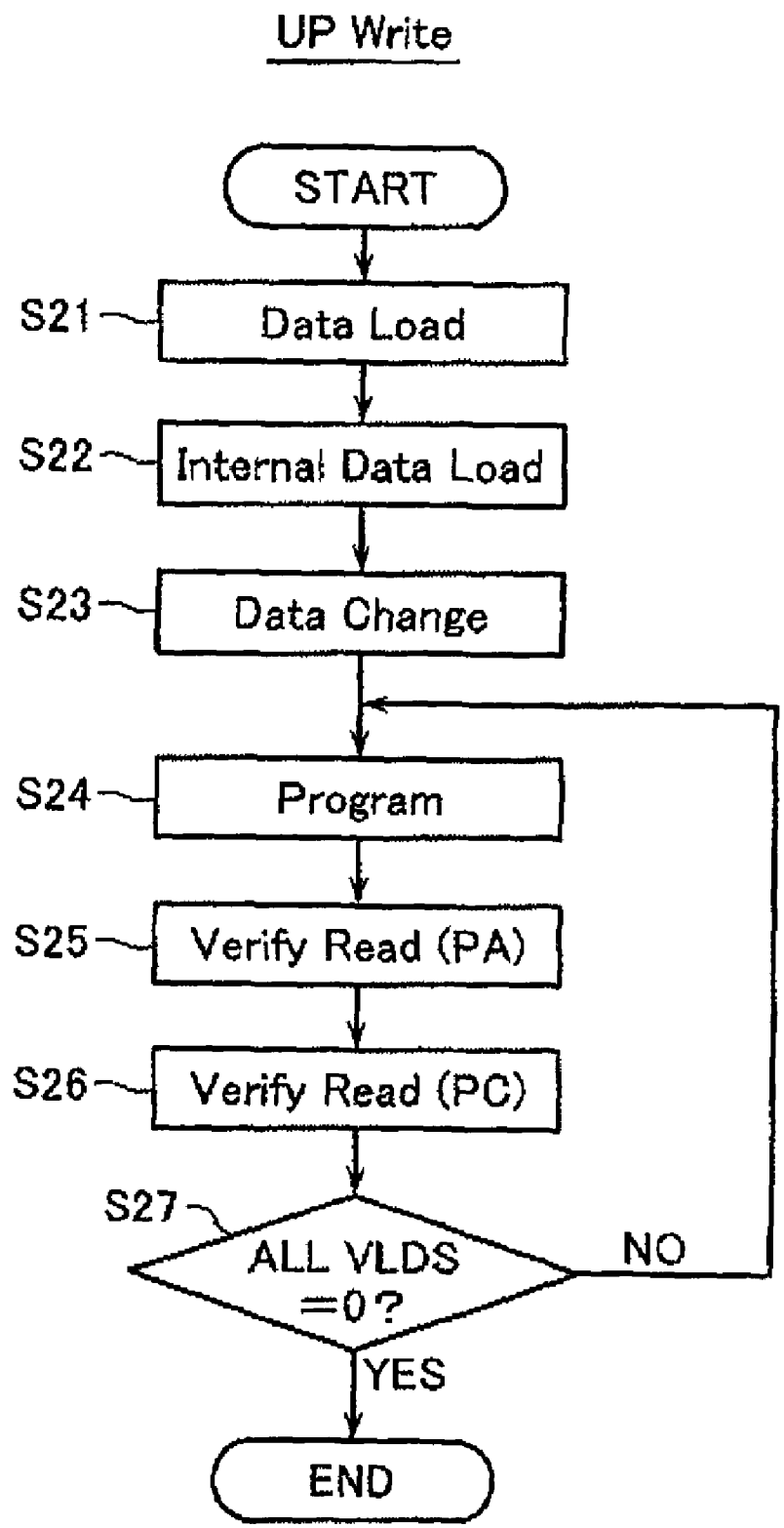
FIG. 15 shows the lower page write sequence of the four-level data.

The upper page (UP) data write will be explained below. FIG. 15 shows an UP data write sequence. Following the command input, address and write data are loaded (step S21). Next, the lower page (LP) data, that has already been written, is read out from the cell array (step S22) because it is in need of referring to the LP data in the UP data write sequence.

For the read out lower page data, data change process is performed for changing the lower data to be adaptable for to-be-written upper page data (step S23).

Then, write voltage application (step S24), and write verify-reads for verifying data states A and C: (steps S25 and S26) are sequentially performed. After verify-reading, it is detected whether all selected cells have been written or not (step S27), and write and verify-read are repeated until the write completion is judged.

FIG. 16 shows data state change of data latches VL and VLB in the upper page write sequence on the bit line side BL with respect to write data E, A, B and C.

As different from the lower page write, externally supplied write data is loaded in data latch VLB as it is, i.e., without inverting. Further, since it is in need of referring to the lower page data in the upper page data write sequence, internal data load (IDL) is performed to read out the lower page data from the cell array and load them in data latches VL. "IDL" shown in FIG. 16 designates the data state of data latches VL and VLB on the assumption that the read data of the cell array is loaded in data latch VL as it is.

As well as the lower page write, data of the data latch VL is used for controlling voltage of the selected bit line BL. However, data after IDL shown in FIG. 16 is not suitable for the bit line controlling. Therefore, previous to write "PRG", desirable data level change operation is performed. In detail, when data is "1" in data latch VLB, data in data latch VL is inverted. This is in practice performed as a suitable data processing when read data is transferred to data latch VL.

Explaining in detail, in case of data level E write, bit line BL is to be set at Vdd because threshold shift is not desired. Therefore, it is necessary to set data "0" in data latch VL. Further, in case of data level C write, to shift the threshold level, it is required of bit line BL to be set at 0V, i.e., data latch VL is to be set at data "1".

Data state at "PRG" time in FIG. 16 shows that data in data latches VL have been changed with respect to data levels E and C. The above-described data change process is performed as a logic operation of XOR gate G0 with NMOS transistors MN1 and MN2 in the data transfer control circuit DL. The procedure will be explained in detail below.

The internal data read is performed with a normal data read without regard to the write data in data latch VLB. Bit line precharge is performed with bit line precharge circuit 22. The precharge circuit 21b and pull-up circuit 22 are kept off.

Applied to the selected word line on the selected information cell side is read voltage RB; and applied to the selected word line on the reference cell side is read voltage Rr. As a result, as similar to the normal read operation, selected information cell data state E or B are sequentially sensed for the respective bit lines by the sense amplifier S/A.

Sensed data of the bit line BL0 is inverted if necessary in accordance with data in data latch VLB0 and transferred to data latch VL0. For this purpose, prior to the data sensing, data in data latch VLB0 is transferred to data latch CL in the data transfer control circuit DL with VLSB0=CLE="0" and CLEB="L". In addition, setting BISP="L" and RTLE="H", node TLR of data latch TL is precharged via PMOS transistor MP2, so that data latch TL is set at TLR="H" and TLL="L".

Following it, bit line precharge and data sense are performed, and sensed data is transferred to data transfer nodes BIS and BISB with SAOC=SAOBC="H". That is, output nodes OUT and OUTB are coupled to data nodes BIS and BISB, respectively.

As a result, art XOR logic operation is taken between data of data latch VLB0 (i.e., data in data latch CL) and sensed data with NMOS transistors MN1 and MN2. That is, when VLB0="1", sensed data is inverted to be transferred to data latch VL0.

The XOR logic operation will be explained in detail. When data in data latch VLB0 is "1", NMOS transistor MN1 is turned on in accordance with data in data latch CL. In this case, if read data is "0" (i.e., OUT="L,", then BIS="L"), with RXE="H", node TLR of data latch TL is discharged to "L" via NMOS transistor MN1. This is latched in data latch TL, and then it is transferred to data latch VL0, whereby data of data latch VL0 becomes "1". As a result, as shown in FIG. 16, in case of cell data C, data of the data latch VL0 is inverted while in case of cell data 8, there is no data inversion.

While, in case data in data latch VLB0 is "0", NMOS transistor MN2 is turned on. In this case, if read data is "1" (i.e., OUTB="L", then BISB="L"), with RXE="H", node TLR of data latch TL is discharged to "L" via NMOS transistor MN2. This is latched in data latch TL, and then it is transferred to data latch VL0, whereby data of data latch VL0 becomes "1". As a result, as shown in FIG. 16, in case of cell data A, data of the data latch VL0 becomes "1" while in case of cell data E, the read data becomes inverted one, "0".

As a result of the data inverting process, data state at the write step "PRG" shown in FIG. 16 may be obtained. Then, setting SAOC=SAOBC="L", connection between the output nodes OUT, OUTB and data nodes BIS, BISB is made off.

Repeating the above-described operation for sequentially selected bit lines (BL0, BL2, . . . ), one page write data may be initially set in data latches VL.

Next, in accordance with write data set in data latches VL, data write is performed. That is, in accordance with data in the respective data latches VL, selected bit lanes are applied with Vdd or Vss with DT=Vdd+Vth, whereby NAND cell channels are controlled in potential. Then, write voltage Vpgm is applied to a selected word line.

In case of data write of the information cells on the bit line BLB side, write data are loaded in data latch VL, and operation processing results for the internal data read are transferred to data latches VLB. Data in data latches are used for bit line voltage controlling. At the operation time after internal data load, LXE and LTLE are used in place of RXE and RTLE. The others are the same as in the write mode on the bit line BL side.

As the upper page write-verify, it is in need of doing A-level verify (AV) for verifying data state A and C-level verify (CV) for verifying data state C shown in FIG. 5. At every verify time, cell current comparison is performed with verify voltage PA or PC for the information cell and verify voltage Pr for the reference cell as shown in FIG. 5.

Since it is required of the verify-read to take a sensing time of about 100 ns and a word line level change time of about several μs, it is desired to use such a driving scheme that the driving speed is made as high as possible. For example, while a word line is kept as it is, AV operations are performed for all bit lines, and after changing the word line level, CV operations are performed for all bit lines. With this scheme, since the word line level change is only one time, it becomes possible to do verify-read at the highest rate.

The upper page verify-read is basically the same as the lower page one, and uses data in data latches VL and VLB. In this embodiment, it is dealt with that only when data of latch VLB is "1", verify-read is performed.

When the upper page write ends, data latch VLB is in the state of PRG shown in FIG. 16. Data of latch VLB may be used as it is for C-level verify, but it is necessary to invert it again for A-level verify.

The data inverting operation in data latch VLB will be performed, with data latch CL in the transfer control circuit DL as follows. Firstly, set BISP="L" and RMRE="H", and turn on PMOS transistor MP2 and NMOS transistors MN12 and MN13. As a result, node CLR of data latch CL, is set at "L".

Next, with VLSB="H", data of data latch VLB is transferred to node BISB. Simultaneously, RINVB is set at "H". In case data of latch VLB is "1" (i.e., BISB="H"), PMOS transistor MP6 is kept Off, and node CLR is kept at "0". By contrast, in case data of latch VLB is "0", PMOS transistors MP5 and MP6 are turned on, and node CLR is charged up to be set at "1".

After holding this data state in latch CL, it will be transferred to data latch VLB via transfer gate T2 and via node BISB. As a result, as shown in the column of "A-Level Verify" shown in FIG. 16, data latch VLB at a write time is inverted.

The above-described data inverting operation is repeatedly performed for eight data latches VLB0-VLB7 per one sense amplifier.

Next, A-level verify-read operation will be explained below. Firstly, data in latch VL is transferred to data latch CL. Following it, data of data latches VL and VLB are transferred to nodes BIS and BISB, respectively. Then, with BISPVE="H", the transferred data are supplied to verify control-use nodes DH and PV, respectively.

In case of PV-"1" (i.e., in case of data in latch VLB is "1"), when signal VR is set at "H", verify-use precharge circuit 21b shown in FIG. 8 is turned on, so that a selected bit line will be precharged. By contrast, in case of PV="0", bit line precharge is not performed, and verify-read also is not performed.

Further, in the A-level verify-read mode, in case of VLB="0" (i.e., in case of data E, C write), and in case of VL="0" (i.e., in case of data E, B write), sense amplifier S/A is forcedly set at OUT="L". This is due to pull-up circuit 22 on the bit line BL side when the bit line BL side is selected. That is, in case of PV="0" or in case of DH="0", pull-up circuit 22 on the bit line BL side is turned on in response to REFR="H", so that current flows into the sense amp input node IN, and OUT="0" ill be obtained.

Therefore, only when PV-DH="1" (i.e., in case of data level A write), verify-read is performed normally. When the threshold voltage of the selected information cell on the bit line BL side is increased to a desired level, and the cell current becomes smaller than that of the reference cell, OUT="L" will be obtained. In the remaining cases, OUT="H" is obtained. VL="RD" shown in the column of A-level verify in FIG. 16 designates that data latch VL becomes "0" or "1" in accordance with the result of verify-read.

Note here that to transfer normally the verify-read data to data latch VL, it is required of the data of latch VL held in data latch CL, to be set again. This is performed by applying LMRE="H". At this time, if BISB="1", NMOS transistors MN10 and MN11 are turned on, whereby node CLL is set at "L". By contrast, if BISB="0" (i.e., in case verify-read is not performed), data in latch CL is kept as it is.

In case of VLB="1", as described above, node CLL of data latch CL is forcedly set at "L". Then, if sense amp output is OUT="H" as a result of the verify-read, it is transferred to node 81S, and data of latch CL will be inverted with RMRE="H". In case of OUT="L", the above-described data inverting does not occur. That is, in case of VL="1", data in latch CL is set again in accordance with the sensed output of the verify-read.

Restoring data in latch CL to data latch VL, one verify-read operation ends. The above-described verify read operations are sequentially performed for all selected bit lines.

Next, C-level verify-read will be performed. Note here that the order of A-level verify-read and C-level verify-read is not a matter. In case A-level verify-read is advanced, since data in latch VLB is inverted, it is required of the C-level verify-read case to invert the data again. If C-level verify-read is advanced, data in latch VLB at the write time "PRG" may be used as it is.

The basic verify-read operation is the same as in the A-level verify-read. That is, data in latch VL is transferred to latch CT, in the transfer control circuit DL. As a result of verify-read, in accordance with data in data latch VLB, it is determined whether data in latch CL is kept as it is or set at the same value as the sensed output.

As shown in FIG. 16, at the C-level verify time, F-level written cell is subjected to verify-read in accordance with VLB="1". At this time, the sensed output is forcedly set at OUT="L" with verify control, pull pull-up circuit 22. That is, since VL="0" with respect to an E-level written cell, this data is transferred to node DH as "H" data via data node BIS, so that pull-up circuit 22 on the bit line BL side is turned on with REFR="H", and OUT="L" will be set.

In addition, similarly in case of VLB="0", OUT="L" will be forcedly set.

As described above, only in case of VLB="1" and VL="1" (i.e., C-level write time), verify-read is normally performed, and data latch CL is set in accordance with the sensed result.

Data in latch CL is transferred to data latch VL. The same verify-read operations will be repeatedly performed for all selected bit lines.

After having performed one write cycle composed of write voltage application, A-level verify and C-level verify, verify-judgment is performed with the collective verify-judgment circuit 23. With respect to an E-level or B-level written information cell, after internal data read, VL="1" (i.e., VLDB=Vdd) will be set. In addition, in a state where all information cells have been written, it will be obtained VLDB<7:0>=Vdd.

Therefore, the signal line VSEN that was previously charged at Vdd becomes VSEN="L" when all cells have been written, and it designates a write completion. If VSEN="L" is not obtained as a result of the collective verify-judgment, the successive write cycle will be performed.

In case of write-verify for the information cells on the bit line BLB side, not only the input relationship between the information cell and the reference cell is reversed to the above-described case dealing with the information cells on the bit line side, but also the utilizing manner of data latches VL and VLB is reversed to the above-described case. Therefore, when data of latches VLB and VL are transferred to nodes DH and PV, respectively, switches circuits SW1 and WS2 are turned on with BISDH="H" in place of BISPVE. Further, LMRE, LINVB and LXE are used in pace of RMRE, RINVB and RXE, respectively. The others in the verify-read operation are the same as above-described case.

(Lower Page Read)

Lower page (LP) read is performed with the read voltages RB and Rr shown in FIG. 5 to read data states E and A as "1", and data states B and C as "0". To achieve high speed reading, data latches VL and VLB are used as caches.

For example, in case even numbered bit lines on the bit line BL side are selected, while a selected word line level is kept as it is, sense data of bit lines BL0, BL2, . . . , BL14 are sequentially transferred to data latches VL0, VL1, . . . , VL7, respectively. Read data in the latches VL are serially transferred to data line IOn to be output via data transfer control circuit DL.

(Upper Page Read)

Upper page (UP) read is performed with two data sense operations with the read voltages RA and RC shown in FIG. 5 and even/odd judgment of "1" data numbers for the sensed result. It is no matter the order of two data sense operations. If the number of "1" data is even, the upper page is UP="1" while the number of "1" data being odd, UP="0".

It is preferred at the upper page read time to make the word line level transitions as less as possible. For this purpose, firstly, data sense operations are sequentially performed for bit lines (BL0, BL2, . . . ) with read voltage kept at RA, and sensed data are transferred to data latches (VL0, VL1, . . . ).

Next, after switching the read voltage from RA to RC, data sense operations are sequentially performed for bit lines (BL0, BL2, . . . ) with read voltage kept at RC, and logic operations are sequentially performed between the sensed data and previously stored data in data latches (VL0, VL1, . . . ), so that the upper page data will be sequentially decided.

The upper page data read will be explained in detail for such a case that information cells on the bit line BL side and reference cells on the bit line BLB side are selected. Word line levels on the information cell side and the reference cell side are set at RA and Rr, respectively. Then, bit line BL0 is precharged with precharge circuit 21a and data sensing thereof is performed. After sensing, the sensed data at the sense output OUT is transferred to node BIS with SAOC="H", and then transferred to data latch VL0.

Similar data sense is performed for the next bit line BL2, and the sensed result is transferred to data latch VL1. The same data sense and data transfer operations are repeatedly performed for all selected bit lines.

Following it, read voltage applied to the selected word line is changed to RC, and data sense operations are performed. Prior to bit line precharge at this time, data in latch VL is transferred to data latch CL in the data transfer control circuit DL. Further, after transferring data of latch VL to latch CL, node TLR of data latch TL is set at "H" via PMOS transistor MP2 and NMOS transistor MN7, which are turned on with BISP="L" and RTLE="H", respectively. This is for performing even/odd judgment in accordance with XOR logic between the previously loaded data in latch VL and the following sensed data in data transfer control circuit DL.

Next, bit line precharge and data sense are performed. The sensed data is transferred to nodes BIS and BISB with SAOC=SAOBC="H", and XOR operation will be performed between data at nodes BIS, BISB and data in latch CL with NMOS transistors MN1 and MN2. Explaining in details, in accordance with whether the node TLR set at "H" in latch TL is discharged or not with RXE="H", an XOR operation result will be latched in data latch TL.

The details will be further explained below. Data sensed in advance has already been transferred to data latch CL from data latch VL. In case the previously sensed data is CLL="H" (="1") and the following sense data transferred to BIS from OUT is BIS="H" (="1"), NMOS transistor MN1 is turned on, but "H" data at node TLR of data latch TL is kept as it is. In case the previously sensed data is CLL="L" and the following sense data transferred to BIS is BIS="L", NMOS transistor MN2 is turned on, but "H" data at node TLR of data latch TL is also kept as it is.

By contrast, In case the previously sensed data is CLL="H" and the following sense data transferred to BIS is BIS="L", or In case the previously sensed data is CLL="L" and the following sense data transferred to BIS is BIS="H", "H" data at node TLR of data latch TL will be discharged via NMOS transistors MN1 or MN2.

As a result, even/odd judgment of "1" data numbers is performed, and the upper page read data will be obtained. The operation result in data latch TL, is transferred to data latch VL as the upper page data.

The same data sense operations and logic operations between the successive two sensed data are sequentially performed for all selected bit lines (BL0, BL2, . . . ), and the respective results are transferred to data latches (VL0, VL2, . . . ).

In case the information cells are selected on the bit line BLB side, the same data processing will be performed as described above except that data latch VLB is used in place of data latch VL, and data processing in latch DL is performed with the data node reversed to that in the above-described case.

When outputting the read data in data latch VL, VLS=CLE=Xi=LYj="H" and CLEB="L" are set. Supposing that data line IOn has been initially set at Vdd, in case data in latch VL is Vdd, data of data line Ion is not changed while in case data is Vss (=0V), data line IOn is discharged. As a result, read data will be output to the external.

When outputting read data in latch VLB, RYj is used in place of LYj.

Random access-use bank RNA-BNK stores binary data as described above. For example, only levels E and B (i.e., lower page data) in the four-level data used in the sequential access-use bank SQA-BNK are used as data. In case of data write on the bit line BL side, it is the same as in case of four-level data write scheme that write data are sequentially loaded in latches VL, and then collectively written.

At the write verify-read time and normal data read time, bit line data are sequentially sensed and temporarily stored in data latches VL, and then the read data will be transferred and output via the transfer control circuit. It is not required to perform complicate data processing such as data inverting and the like used at the lower page write time in four-level data storage scheme, and it is used basically the same operations as at a normal binary data read time.

Since the random access-use bank RNA-BNK has shorter word lines than the sequential access-use bank SQA-BNK, it becomes possible to perform high-speed random accessing.

Figure 17:
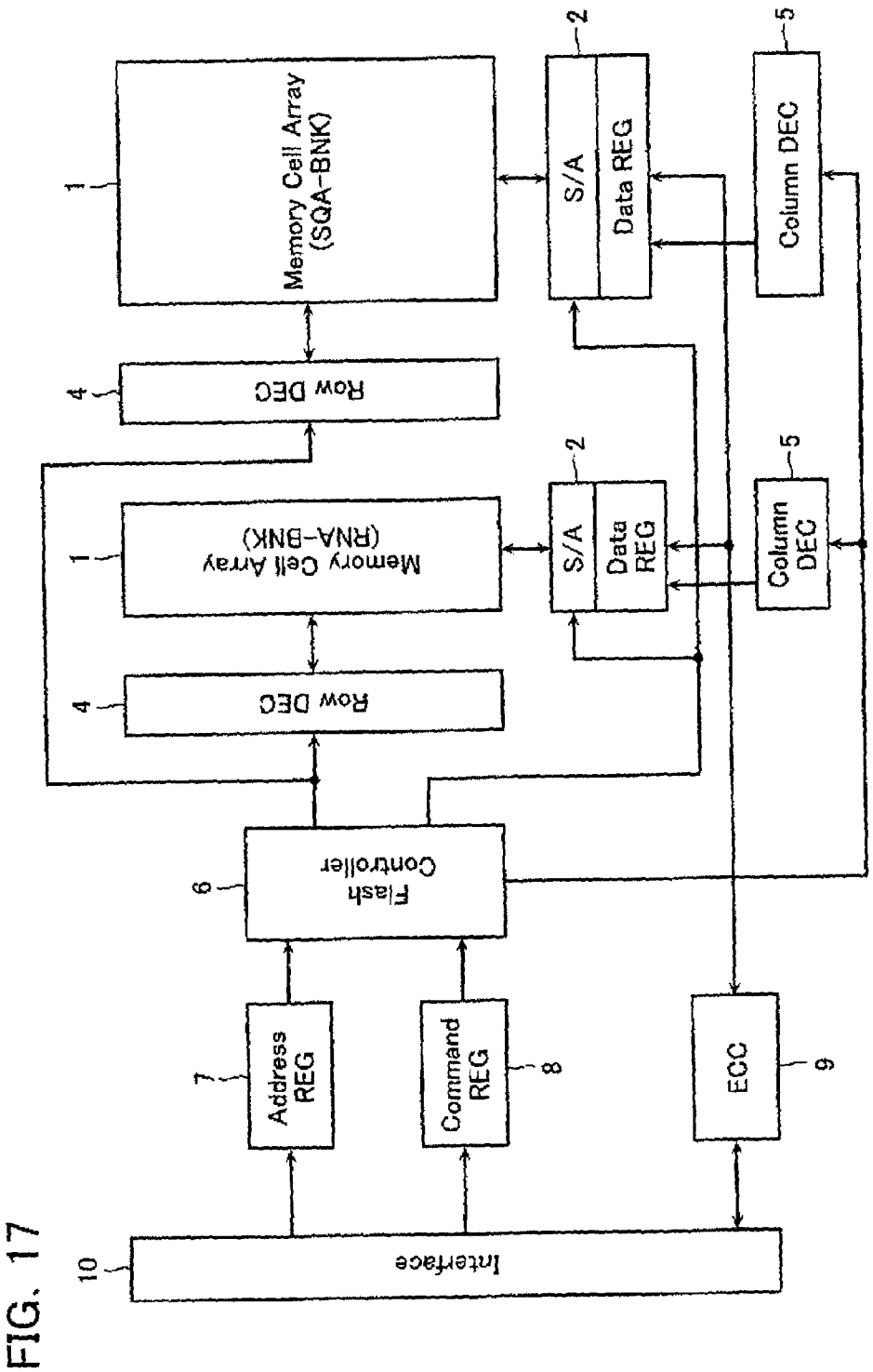
FIG. 17 shows a functional block of the NAND-type flash memory in accordance with the embodiment.

FIG. 17 shows a functional block of a NAND-type flash memory chip in accordance with this embodiment. Two kinds of memory cell arrays, which constitute a sequential access-use bank SQA-BNK and a random access-use bank RNA-BNK, respectively, are controlled with the respective row decoders 4 and the respective sense units 2. Column decoders 5 are also prepared for the respective banks.

Data, address and command are supplied via interface 10. Command is supplied to flash memory controller 6 via command register 8. Address is transferred to row decoders 4 and column decoders 5 via flash controller 6.

Since the random access-use bank RNA-BNK is random accessible, it is required of the interface 10 to be formed as that used in an SRAM or a NOR-type flash memory. That is, to access the random access-use bank RNA-BNK, it is in need of directly supplying row and column addresses. For the purpose, it is necessary to prepare address pins, the number of which is sufficient to access RNA-BNK.

By contrast, SQA-BNK is for storing data with a large capacity. Therefore, if there are prepared address pins necessary to be sufficiently accessible, the number becomes very large. In consideration of this, address data are supplied in a time-divisional manner to access RNA-BNK as similar to a normal NAND-type flash memory device. Explaining in detail, address excluding RNA-BNK is input into address pins as register address. Following it, addresses of SQA-BNK are sequentially input in a time divisional manner via data pins.

By use of the above-described address input scheme, it becomes possible to prevent the address pins from being increased in number even if SQA-BNK is increased in capacity. If RNA-BNK is increased in capacitance, it is required to increase the number of address pins because it is random access one.

Being enhanced in capacity increase and miniaturization, a NAND-type flash memory has a large error rate. To detect and correct read data errors, an ECC circuit 9 is installed in the chip. As a result, there is no need of correcting errors outside of the chip, and it becomes possible to output error-corrected read data to the external. Specifically, it becomes possible to output boot data, which are to be subjected to random accessing, and program data such as OS in such a state that error(s) has been corrected. Therefore, it is able to store the boot data in the random access-use bank RNA-BNK without preparing any boot-use ROM.

Figure 18:
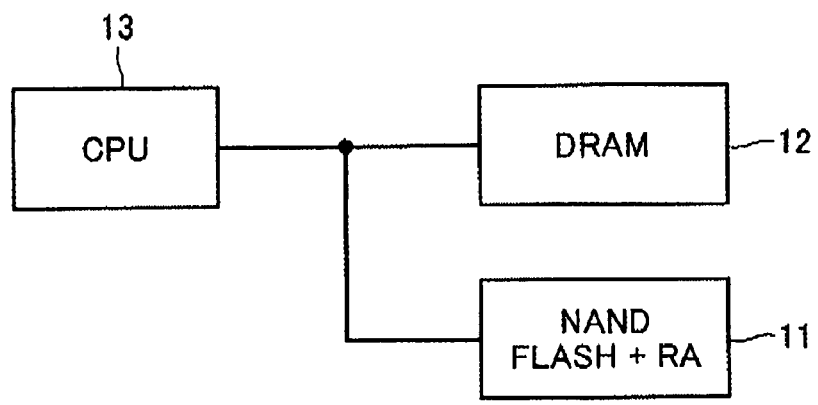
FIG. 18 shows a memory system with the NAND-type flash memory in accordance with the embodiment.

FIG. 18 shows a memory system with the flash memory chip 11 in accordance with this embodiment. Since the flash memory 11 has an ECC circuit formed therein, it has no need of preparing any memory controller. Further, having an RNA-BNK, the flash memory needs not prepare a boot-use ROM.

Although the flash memory has the random access-use bank RNA-BNK, it is necessary for program execution to use a RAM with a higher speed performance. Therefore, DRAM 12 is prepared in the system. System boot is performed by use of the above-described flash memory 11, and CPU 13 directly accesses RNA-BNK in the flash memory 11 to make the program executed. Alternatively, it is also possible to read data in SQA-BNK in the memory 11 to transfer it to DRAM 12, and make the program executed on DRAM 12.

SQA-BNK in the NAND-type flash memory has an access unit referred to as a sector (e.g., 528 Byte). However, if error correction is performed for every sector, it takes a long time for error-detecting and correcting because the data unit is large.

By contrast, a data access unit of the random accessible RNA-BNK is not defined by the above-described sector but defined by 32 bit (or 64 bit, or 128 bit). Calculating data in parallel with the above-described access unit, the time length necessary for error-detecting and correcting may be made relatively short.

In consideration of the above-described situations, to use a common ECC circuit for error-detecting and correcting both RNA-BNK and SQA-BNK, it is preferred to calculate error-detection and correction of data in SQA-BNK with a data length, for example 32 bit, that is smaller than the sector serving as the access unit. As a result, it becomes possible to error-detect and correct for two data areas at a high rate with the common ECC circuit.

As an embodiment, an electric card using the non-volatile semiconductor memory devices according to the above-described embodiment of the present invention and an electric device using the card will be described bellow.

Figure 19:
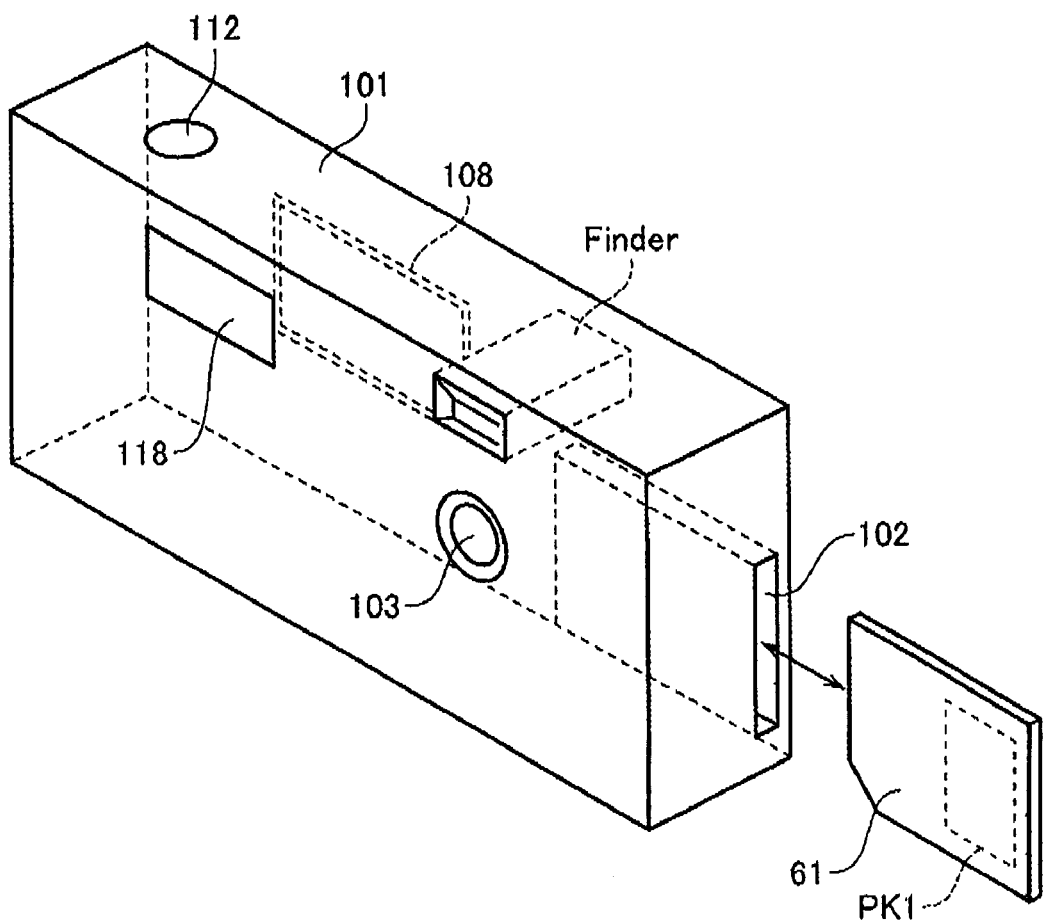
FIG. 19 shows another embodiment applied to a digital still camera.

FIG. 19 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 20:
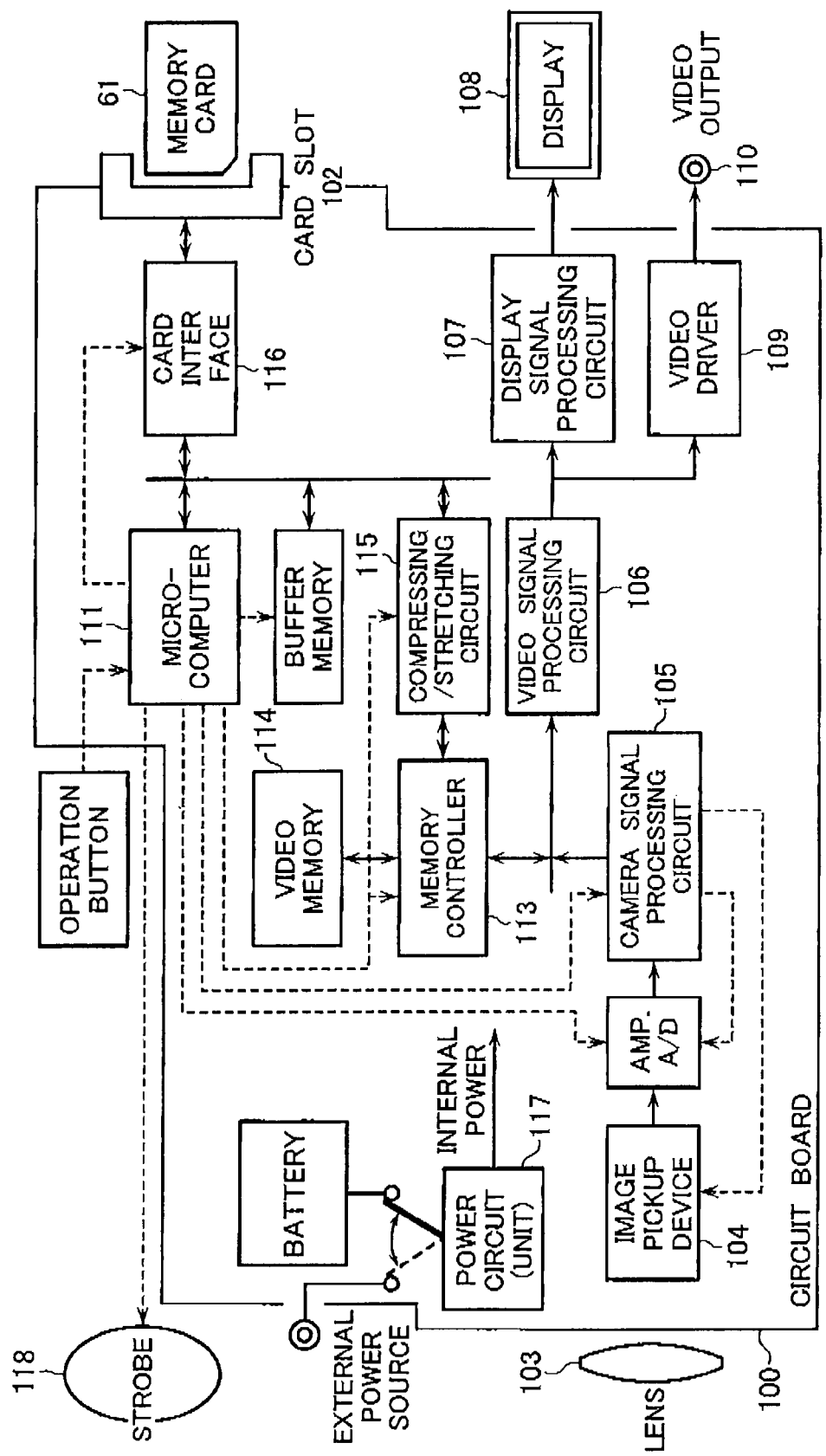
FIG. 20 shows the internal configuration of the digital still camera.
Figure 21A:
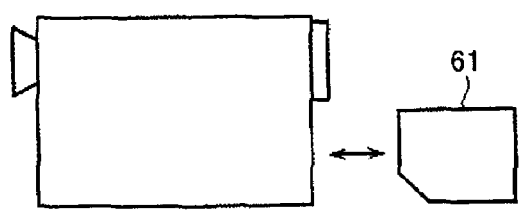
FIGS. 21A to 21J show other electric devices to which the embodiment is applied.
Figure 21F:
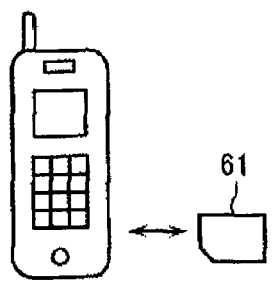
Figure 21B:
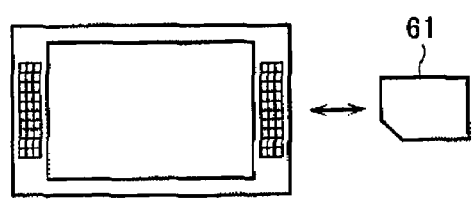
Figure 21G:
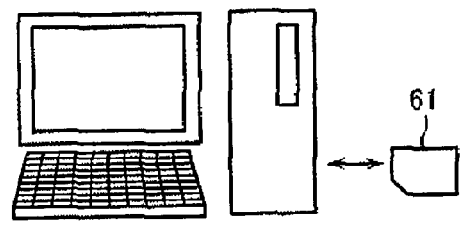
Figure 21C:
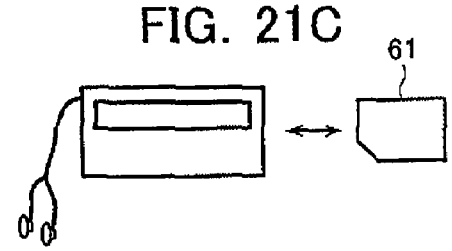
Figure 21H:
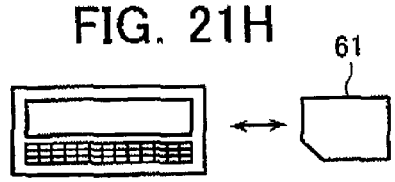
Figure 21D:
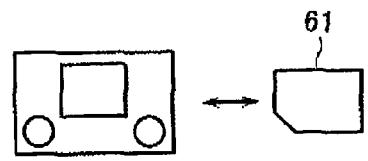
Figure 21I:
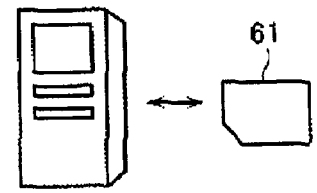
Figure 21E:
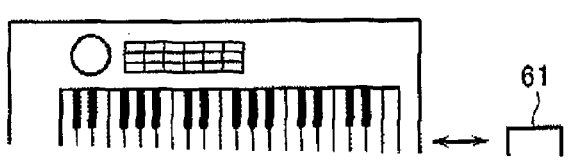
Figure 21J:

FIG. 20 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 21A to 21J, as well as in portable electric devices. That is, the electric card can also be used in a video camera shown in FIG. 21A, a television set shown in FIG. 21B, an audio apparatus shown in FIG. 21C, a game apparatus shown in FIG. 21D, an electric musical instrument shown in FIG. 21E, a cell phone shown in FIG. 21F, a personal computer shown in FIG. 21G, a personal digital assistant (PDA) shown in FIG. 21H, a voice recorder shown in FIG. 21I, and a PC card shown in FIG. 21J.

This invention is not limited to the above-described embodiment. It will be understood by those skilled in the art that various changes in form and detail may be made without departing from the spirit, scope, and teaching of the invention.

What is claimed is:

1. A semiconductor memory device with NAND strings arranged therein, the NAND string having a plurality of electrically rewritable and non-volatile memory cells connected in series, comprising:

a first data area; and a second data area, which is smaller in capacity than the first data area and random accessible at a higher rate than the first data area, wherein the first data area is sequentially accessed in such a way that a sector defined by a certain number of bits serves as an access unit, and the second data area has a word line length shorter than that of the first data area.

2. A semiconductor memory device with NAND strings arranged therein, the NAND string having a plurality of electrically rewritable and non-volatile memory cells connected in series, comprising:

a first data area; and a second data area, which is smaller in capacity than the first data area and random accessible at a higher rate than the first data area, wherein two random access-use banks are disposed on opposite sides of a peripheral circuit area positioned at the center of the device to serve as the second data area, and two sequential access-use banks are disposed outside the random access-use banks to serve as the first data area.

3. The semiconductor memory device according to claim 2, wherein each of the random access-use bank and the sequential access-use bank includes:

first and second cell arrays, main portions of which are formed of information cell NAND strings used for storing data, the remaining portions being formed of reference cell NAND strings; and a sense unit is disposed between the first and second cell arrays to detect a cell current difference between an information cell NAND string selected from one of the cell arrays and a reference cell NAND string selected from the other, and sense data.

4. The semiconductor memory device according to claim 3, wherein a first sense unit and a second sense unit are disposed on the sequential access-use bank area and the random access-use bank area, respectively, to be controlled with common control signals supplied from the peripheral area, and a transfer gate circuit is disposed between the random access-use bank and the sequential access-use bank so as to selectively set the signal lines, on which the common control signals are supplied, on the side of the sequentially access-use bank at a fixed level for making the first sense unit inactive.

5. The semiconductor memory device according to claim 2, wherein
the random access-use bank serves for storing binary data while the sequential access-use bank serves for storing multi-level data.

6. The semiconductor memory device according to claim 2, wherein
a common ECC circuit is disposed for the random access-use bank and the sequential access-use bank, the ECC circuit being formed for error-detecting and correcting read out data for every data unit smaller than a sector serving as an access unit of the sequential access-use bank.

7. A semiconductor memory device comprising:
a first data area including first and second cell arrays, in which a plurality of electrically rewritable and non-volatile memory cells are arranged, main portions thereof serving as information cells for storing data while the others serve as reference cells;
a first sense unit disposed between the first and second cell arrays to detect a current difference between an information cell selected from one cell array and a reference cell selected from the other cell array to sense data;
a second data area including third and fourth cell arrays, in which a plurality of electrically rewritable and non-volatile memory cells are arranged, main portions thereof serving as information cells for storing data while the others serve as reference cells; and
a second sense unit disposed between the third and fourth cell arrays to detect a current difference between an information cell selected from one cell array and a reference cell selected from the other cell array to sense data,
wherein
the first data area serves as such a sequential access-use bank that a sector defined by a certain number of bits serves as an access unit while the second data area serves as such a random access-use bank that is smaller in capacity than the first data area and random accessible at a higher rate than the first data area.

8. The semiconductor memory device according to claim 7, wherein
the first data area is a file data area serving for storing multi-level data while the second data area is a program data area serving for storing binary data.

9. The semiconductor memory device according to claim 7, wherein
in the first to fourth cell arrays, a plurality of the information cells are connected in series to constitute an information cell NAND string while a plurality of the reference cells are connected in series to constitute a reference cell NAND string.

10. The semiconductor memory device according to claim 7, wherein
the second data area serving as the random access-use bank is disposed near a peripheral circuit area of the device while the first data area serving as the sequential access-use bank is disposed next to the second data area.

11. The semiconductor memory device according to claim 10, further comprising:
common control lines disposed as extending to the sequential access-use bank from the peripheral circuit area so as to control the first sense unit in the sequential access-use bank and the second sense unit in the random access-use bank; and
a transfer gate circuit disposed midway on the common control signal lines to selectively set the common control line portions located on the sequential access-use bank area at a fixed potential, thereby making the first sense unit inactive.

12. The semiconductor memory device according to claim 7, wherein
each of the first and second sense units comprises a sense amplifier configured to detect a current difference between an information cell selected in a cell array and a reference cell selected simultaneously in another cell array.

13. The semiconductor memory device according to claim 12, wherein
each of the first and second sense units further comprises:
first data latches disposed for storing write data to be written into one cell array;
second data latches disposed for storing write data to be written into the other cell array;
a first data transfer node, via which the first data latches and the sense amplifier or a data line are selectively coupled;
a second data transfer node, via which the second data latches and the sense amplifier or the data line are selectively coupled; and
a transfer control circuit configured to control data transferring between the first and second data latches and the sense amplifier or the data line.

14. The semiconductor memory device according to claim 10, wherein
the second data area has two random access-use banks disposed at opposite sides of the peripheral circuit while the first data area has two sequential access-use banks disposed next to the two random access-use banks.

15. The semiconductor memory device according to claim 13, wherein
the first data area serves for storing four-level data defined by (UP, LP) (where UP is an upper page bit; and LP a lower page bit), and
an upper page write sequence is performed in such a manner that write data are stored in one of the first and second data latches while internally read out lower page data are stored in the other.

16. The semiconductor memory device according to claim 15, wherein
the transfer control circuit used in the first sense unit has such a logic operation circuit that decide the following write data in the upper page write sequence based on the verify-read result and the stored lower page data.

17. The semiconductor memory device according to claim 7, wherein
a common ECC circuit is disposed for the random access-use bank and the sequential access-use bank, the ECC circuit being formed for error-detecting and correcting read out data for every data unit smaller than the sector serving as the access unit of the sequential access-use bank.

* * * * *